United States Patent
Zenou

(10) Patent No.: US 11,497,124 B2
(45) Date of Patent: Nov. 8, 2022

(54) METHODS FOR PRINTING CONFORMAL MATERIALS ON COMPONENT EDGES AT HIGH RESOLUTION

(71) Applicant: IO Tech Group Ltd., London (GB)

(72) Inventor: Michael Zenou, Hashmonaim (IL)

(73) Assignee: IO Tech Group Ltd., Modiin (IL)

( * ) Notice: Subject to any disclaimer, the term of this patent is extended or adjusted under 35 U.S.C. 154(b) by 0 days.

(21) Appl. No.: 17/302,449

(22) Filed: May 3, 2021

(65) Prior Publication Data
US 2021/0385951 A1    Dec. 9, 2021

Related U.S. Application Data

(60) Provisional application No. 62/705,682, filed on Jul. 10, 2020, provisional application No. 62/705,046, filed on Jun. 9, 2020.

(51) Int. Cl.
*H05K 3/28* (2006.01)
*H05K 3/00* (2006.01)
(Continued)

(52) U.S. Cl.
CPC ........... *H05K 3/282* (2013.01); *H05K 3/0091* (2013.01); *C23C 14/34* (2013.01);
(Continued)

(58) Field of Classification Search
CPC .. C23C 14/34; C23C 14/3435; H05K 3/1283; H05K 3/282; H05K 3/0026; H05K 3/0091; H05K 2203/107; H05K 2203/1366
(Continued)

(56) References Cited

U.S. PATENT DOCUMENTS 5,155,324 A    10/1992  Deckard et al.
5,204,055 A    4/1993   Sachs et al.
(Continued)

FOREIGN PATENT DOCUMENTS

CN    103597589 A      2/2014
DE    102011083627 A1  3/2013
(Continued)

OTHER PUBLICATIONS

International Search Report and Written Opinion dated Jun. 24, 2020, from the ISA/European Patent Office, for International Patent Application No. PCT/IB2020/053827 (filed Apr. 22, 2020), 15 pages.
(Continued)

*Primary Examiner* — Brian K Talbot
(74) *Attorney, Agent, or Firm* — Ascenda Law Group, PC

(57) ABSTRACT

Systems and methods that enable printing of conformal materials and other waterproof coating materials at high resolution. An initial printing of a material on edges of a component is performed at high resolution in a first printing step, and a subsequent printing of the material on remaining surfaces of the component is applied in a second printing step, with or without curing of the material printed on the edges between the two printing steps. The printing of the material may be performed by a laser-assisted deposition or using another dispensing system to achieve a high resolution printing of the material and a high printing speed.

10 Claims, 21 Drawing Sheets

(51) Int. Cl.
*C23C 14/34* (2006.01)
*H05K 3/12* (2006.01)

(52) U.S. Cl.
CPC ........ *C23C 14/3435* (2013.01); *H05K 3/0026* (2013.01); *H05K 3/1283* (2013.01); *H05K 2203/107* (2013.01); *H05K 2203/1366* (2013.01)

(58) Field of Classification Search
USPC .............. 427/96.2, 282, 466, 467, 581, 596; 204/192.1
See application file for complete search history.

(56) References Cited

U.S. PATENT DOCUMENTS

| | | | |
|---|---|---|---|
| 5,236,637 | A | 8/1993 | Hull |
| 5,436,083 | A | 7/1995 | Haluska et al. |
| 5,506,607 | A | 4/1996 | Sanders, Jr. et al. |
| 5,740,051 | A | 4/1998 | Sanders, Jr. et al. |
| 5,837,960 | A | 11/1998 | Lewis et al. |
| 6,122,036 | A | 9/2000 | Yamasaki et al. |
| 6,537,359 | B1 | 3/2003 | Spa |
| 7,198,736 | B2 | 4/2007 | Kasuga et al. |
| 7,438,846 | B2 | 10/2008 | John |
| 7,658,603 | B2 | 2/2010 | Medina et al. |
| 7,892,474 | B2 | 2/2011 | Shkolnik et al. |
| 8,236,373 | B2* | 8/2012 | Fumo .................... H05K 3/061 427/96.2 |
| 8,252,223 | B2 | 8/2012 | Medina et al. |
| 8,740,040 | B2 | 6/2014 | Choi et al. |
| 9,636,873 | B2 | 5/2017 | Joyce |
| 9,808,822 | B2 | 11/2017 | Martensson et al. |
| 9,901,983 | B2 | 2/2018 | Hovel et al. |
| 10,144,034 | B2 | 12/2018 | Zenou |
| 2004/0101619 | A1 | 5/2004 | Camorani |
| 2005/0109734 | A1 | 5/2005 | Kuriyama et al. |
| 2005/0212888 | A1 | 9/2005 | Lehmann et al. |
| 2007/0164089 | A1 | 7/2007 | Gaugler |
| 2007/0201122 | A1 | 8/2007 | Dozeman et al. |
| 2008/0166490 | A1 | 7/2008 | Hogan et al. |
| 2009/0074987 | A1 | 3/2009 | Auyeung et al. |
| 2009/0217517 | A1 | 9/2009 | Pique et al. |
| 2009/0274833 | A1 | 11/2009 | Li et al. |
| 2011/0017841 | A1 | 1/2011 | Holm et al. |
| 2013/0176700 | A1 | 7/2013 | Stevens et al. |
| 2013/0224474 | A1 | 8/2013 | Theunissen et al. |
| 2015/0033557 | A1* | 2/2015 | Kotler .................... H05K 3/225 29/847 |
| 2015/0239236 | A1 | 8/2015 | Stefani et al. |
| 2016/0233089 | A1 | 8/2016 | Zenou et al. |
| 2017/0120260 | A1 | 5/2017 | Oetjen |
| 2017/0189995 | A1* | 7/2017 | Zenou ..................... H05K 3/18 |
| 2017/0210142 | A1 | 7/2017 | Kotler et al. |
| 2017/0250294 | A1* | 8/2017 | Zenou ................ B23K 26/0624 |
| 2017/0306495 | A1* | 10/2017 | Kotler .................... C23C 14/225 |
| 2017/0348908 | A1 | 12/2017 | Liu et al. |
| 2018/0015502 | A1* | 1/2018 | Zenou .................. B29C 64/106 |
| 2018/0090314 | A1* | 3/2018 | Kotler ..................... B41J 2/005 |
| 2018/0193948 | A1* | 7/2018 | Zenou ................ B23K 26/064 |
| 2018/0281243 | A1* | 10/2018 | Zenou ................ B22D 23/003 |
| 2019/0143449 | A1* | 5/2019 | Zenou ................ B23K 26/146 219/76.1 |
| 2019/0150292 | A1* | 5/2019 | Tsukada ............... H05K 3/1283 427/97.4 |
| 2019/0322036 | A1* | 10/2019 | Zenou .................. B29C 64/209 |
| 2020/0350275 | A1 | 11/2020 | Zenou et al. |
| 2021/0028141 | A1* | 1/2021 | Zenou ................. H01L 21/4846 |
| 2021/0237184 | A1 | 8/2021 | Zenou et al. |
| 2021/0267067 | A1 | 8/2021 | Ziv et al. |
| 2022/0040912 | A1 | 2/2022 | Zenou et al. |

FOREIGN PATENT DOCUMENTS

| | | |
|---|---|---|
| DE | 102017120750 A1 | 3/2019 |
| EP | 1213083 A2 | 6/2002 |
| EP | 3032933 A1 | 6/2016 |
| EP | 3089573 A1 | 11/2016 |
| EP | 3219412 A1 | 9/2017 |
| EP | 3468312 A1 | 4/2019 |
| JP | H01 221466 A | 9/1989 |
| WO | 01/72489 A2 | 10/2001 |
| WO | 2007/020644 A1 | 2/2007 |
| WO | 2007/026366 A1 | 3/2007 |
| WO | 2007/084888 A2 | 7/2007 |
| WO | 2014/078537 A1 | 5/2014 |
| WO | 2014/113937 A1 | 7/2014 |
| WO | 2014/126837 A2 | 8/2014 |
| WO | 2015/144967 A2 | 10/2015 |
| WO | 2015/192146 A1 | 12/2015 |
| WO | 2016/020817 A1 | 2/2016 |
| WO | 2016/124708 A1 | 8/2016 |
| WO | 2016/198291 A1 | 12/2016 |
| WO | 2018/003000 A1 | 1/2018 |
| WO | 2018/104432 A1 | 6/2018 |
| WO | 2018/136480 A1 | 7/2018 |
| WO | 2018216002 A1 | 11/2018 |

OTHER PUBLICATIONS

Written Opinion of the International Preliminary Examining Authority dated Mar. 19, 2021, from the IPEA/European Patent Office, for International Patent Application No. PCT/IB2020/053827 (filed Apr. 22, 2020), 6 pgs.
International Search Report and Written Opinion dated Apr. 16, 2021, from the ISA/European Patent Office, for International Patent Application No. PCT/IB2021/050025 (filed Jan. 5, 2021), 13 pgs.
International Search Report and Written Opinion dated Apr. 1, 2021, from the ISA/European Patent Office, for International Patent Application No. PCT/IB2021/050026 (filed Jan. 5, 2021), 13 pgs.
International Preliminary Report on Patentability dated Jul. 27, 2021, from the IPEA/European Patent Office, for International Patent Application No. PCT/IB2020/053827 (filed Apr. 22, 2020), 37 pgs.
International Preliminary Report on Patentability dated Jan. 14, 2022, from the IPEA/European Patent Office, for International Patent Application No. PCT/IB2021/050025 (filed May 1, 2021), 19 pgs.
Written Opinion of the International Preliminary Examining Authority dated Jan. 5, 2022, from the IPEA/European Patent Office, for International Patent Application No. PCT/IB2021/050026 (filed May 1, 2021), 8 pgs.
International Search Report and Written Opinion dated Apr. 29, 2021, from ISA/European Patent Office, for International Patent Application No. PCT/IB2021/050027 (filed Jan. 5, 2021), 11 pgs.
Non-Final Office Action dated Feb. 15, 2022, for U.S. Appl. No. 16/807,489, filed Mar. 3, 2020, 19 pgs.
Amendment filed Mar. 28, 2022, for U.S. Appl. No. 16/807,489, filed Mar. 3, 2020, 17 pgs.
International Preliminary Report on Patentability dated Jun. 15, 2022, from the IPEA/European Patent Office, for International Patent Application No. PCT/IB/2021/050026 (filed Jan. 5, 2021), 6 pgs.
Non-Final Office Action dated May 9, 2022, for U.S. Appl. No. 15/949,281, filed Apr. 22, 2020, 11 pgs.
Notice of Allowance dated Jun. 16, 2022, for U.S. Appl. No. 16/807,489, filed Mar. 3, 2020, 9 pgs.
Non-Final Office Action dated Jun. 23, 2022 for U.S. Appl. No. 17/247,781, filed Jan. 4, 2021, 14 pgs.
Amendment filed Jul. 5, 2022, for U.S. Appl. No. 17/247,981, filed Jan. 4, 2021, 8 pgs.
International Preliminary Report on Patentability dated Jul. 5, 2022, from the IPEA/European Patent Office, for International Patent Application No. PCT/IB021/050027 (filed Jan. 5, 2021), 6 pgs.
Amendment filed Jul. 14, 2022, for U.S. Appl. No. 15/929,281, filed Apr. 22, 2020, 10 pgs.

(56) References Cited

OTHER PUBLICATIONS

Final Office Action dated Aug. 16, 2022, for U.S. Appl. No. 15/949,281 (filed Apr. 22, 2020), 14 pgs.
Chinese Patent Publication No. 103597589 A, published Feb. 19, 2014, English translation, 33 pgs.

* cited by examiner

METHODS FOR PRINTING CONFORMAL MATERIALS ON COMPONENT EDGES AT HIGH RESOLUTION

RELATED APPLICATIONS

This is a NONPROVISIONAL of, claims priority to, and incorporates by reference U.S. Provisional Application No. 62/705,682, filed 10 Jul. 2020, and U.S. Provisional Application No. 62/705,046, filed 9 Jun. 2020.

FIELD OF THE INVENTION

The present invention relates to systems and methods that enable printing of conformal materials and other waterproof coating materials at high resolution, for example at edges of a component.

BACKGROUND

For today's electronic products, reliability is critical. Consumers expect dependable function, uninterrupted long-term use, and cost effectiveness. As a result, conformal coatings and encapsulation materials have been developed to meet the needs of most electronic devices. Without these critical materials, the printed circuit boards (PCBs), which are arguably the foundation of all consumer electronics, would be susceptible to failure due to corrosion, high temperatures, moisture, vibration, and other environmental hazards. Conformal coating materials protect PCBs and advanced substrates from thermal shock, moisture, corrosive liquids, and other adverse environmental conditions. Shielding electronic function from external influences ensures long product lives for harsh marine, automotive, medical, and consumer electronics applications.

The use of conformal coatings is wide-spread in the electronics industry. However, many materials used in the field have a low surface tension and the edges of the components are not covered well because of a drift of the materials away from the edges of the components to its respective centers. Conventional deposition techniques will not result in a covering of the edges unless a thick coating of material is used. But, a thick coating increases the overall temperature the component is exposed to during operation and thereby shortens the component's life.

SUMMARY OF THE INVENTION

In light of the foregoing shortcomings of conventional deposition techniques for conformal coating, the present inventor has recognized the need for a solution that provides both deposition of the conformal coating at a high resolution and that exposes the coating to ultraviolet (UV) curing gradually, beginning at the edges of the component first and proceeding to the rest of the coating material thereafter. The present invention provides, in various embodiments, a novel deposition technique for conformal coatings at a high resolution, initially directly on edges of a component and thereafter on remaining portions of the component, with optional UV curing of the deposited coating material performed between the deposition steps.

In one embodiment of the invention, a conventional dispenser is used for the edge deposition. In other embodiments, for example where height difference between components on a PCB provide difficulties when using a conventional dispenser, the conformal material is dispensed by way of laser-induced jetting or laser-induced spraying. Conventional dispensers may not be able to penetrate close enough to each component's edges and, as a result, a thicker conformal coating may be needed to ensure that the edges are adequately coated. To avoid the need for such a thicker coat, laser-induced jetting and/or spraying allows the coating material to be transferred at a very high resolution from a relatively high distance above the PCB (up to several mm) to the edges of the component. One example of a laser-induced jetting approach suitable for use in accordance with embodiments of the present invention is disclosed in U.S. Pat. No. 10,144,034 by the present inventor and assigned to the present applicant.

In various embodiments of the invention, a material (e.g., a highly viscous material, a wax material, a polymer material, a mix of a polymer and a monomer material, a heat or light sensitive low viscosity material, a material that can be cured by UV light or by heating, or a material that can be dried) is printed (e.g., using a laser-based system) on edges of an electronic component to create a polymeric layer thereon and the material so printed is thereafter cured (e.g., by UV light, heat, or both). Following curing of the material printed on the edges of the electronic component, a second printing of the material over remaining portions of the component and curing of the material applied during the second printing takes place. In either or both of the printing steps, printing may be performed using laser-induced jetting, laser-induced spraying, or both. For example, the material may be printed as droplets jetted or sprayed from a layer of the material coated on a transparent or semi-transparent substrate.

The layer of the material may be coated on the transparent or semi-transparent substrate by a coating system, for example one that uses a well-defined gap between rollers or knifes to leave a uniform layer of material on the substrate with a thickness that is defined by the gap. Or, the coating system may be one that includes a screen-printing module, a dispenser or an ink jet head, a gravure or micro-gravure system, a slot-die system, a roller coating system, etc. In some cases, the coating system may be located inside a closed cell with a controlled environment to prolong the pot life of the material. Also, the coating system may be configured to contain more than one material and to print a plurality materials onto the substrate in a controlled sequence. During printing, the bottom surface of the substrate may be disposed at an acute angle with respect to a top surface of the electronic component, and the electronic component may be inspected after each printing step (e.g., using a separate inspection module or one that is integrated with the laser-based printing system). The droplets of material may vary in volume between the printing steps and/or during individual ones of the printing steps.

BRIEF DESCRIPTION OF THE DRAWINGS

The present invention is illustrated by way of example, and not limitation, in the figures of the accompanying drawings, in which:

FIGS. 3a-3e illustrate steps in a process of printing conformal materials at edges of a component in accordance with an embodiment of the present invention, in which FIG. 3a illustrates an example of a component affixed to a PCB, FIGS. 3b and 3c illustrate material deposition on the component's edges and subsequent curing of the material so deposited, and FIGS. 3d and 3e illustrate material deposition on remaining areas of the component and subsequent curing of the material so deposited.

DETAILED DESCRIPTION

The present invention provides systems and methods for printing conformal materials (e.g., a polymeric material) 16 and other waterproof coating materials at high resolution. In one embodiment of the invention, the material 16 is a highly viscous material. In one embodiment of the invention, the material 16 is a wax material. In one embodiment of the invention, the material 16 is a polymer material or a mixture of a polymer and a monomer material. In one embodiment of the invention, the material 16 is a heat or light sensitive low viscosity material. In one embodiment of the invention, the material 16 is a material that can be cured by ultraviolet (UV) light or heat. In one embodiment of the invention, the material 16 is a material that can be dried.

Figure 1B:
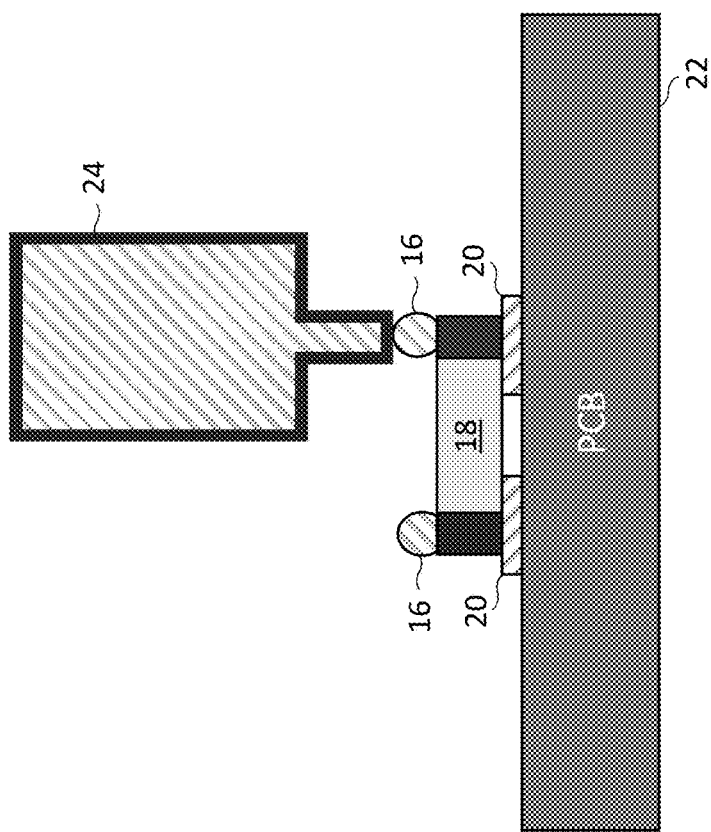
FIGS. 1a and 1b illustrate the use of a laser deposition system and a contact gap printing system, respectively, to print materials on component edges, in accordance with embodiments of the present invention.
Figure 1A:
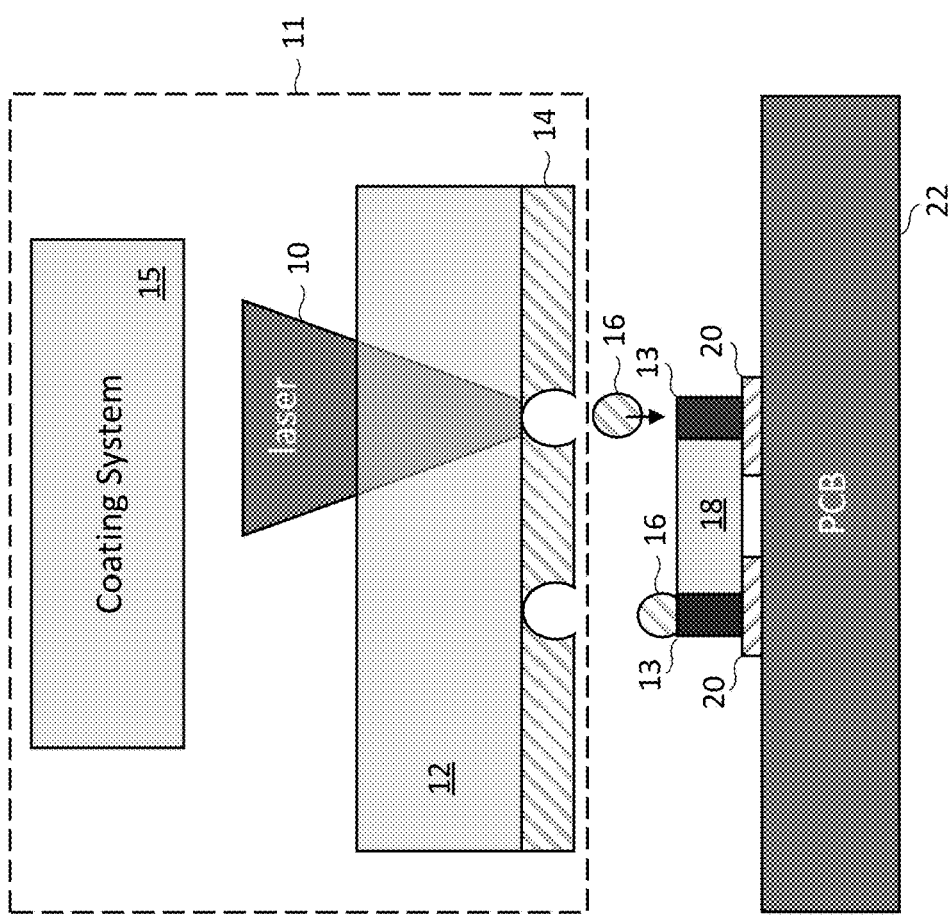

As shown in FIGS. 1a and 1b, systems configured in accordance with embodiments of the invention perform an initial printing on one or more edges 13 of a component 18 affixed to a PCB 22 at a very high printing quality, and subsequently coat remaining areas of the component 18 in a second printing step (shown in later figures), with or without curing of the material printed at the edges 13 of the component 18 between the two printing steps.

The component 18 may include an electronic component. More specifically, the component 18 may include an integrated circuit that has been encapsulated in a protective package. For clarity, it is noted that the package of the integrated circuit may be distinct from the conformal coating discussed herein. Edges 13 of a component 18 generally refer to a perimeter region of each planar (or substantially planar) surface of the component 18. The component 18 may be mounted to PCB 22 using a conductive material 20. The conductive material 20 may include pins/leads of an integrated circuit. The conductive material 20 may also include solder (e.g., solder balls, solder paste, etc.) used to electrically connect respective terminals and/or pins/leads of the integrated circuit to corresponding pads of the PCB 22.

In various embodiments, the material deposition may be performed by laser assisted deposition (e.g., laser induced jetting and/or laser induced spraying), or by another dispensing system to achieve a high resolution deposition of the material and at a high deposition speed. One example of a laser-induced jetting approach suitable for use as a deposition technique in accordance with embodiments of the present invention is disclosed in U.S. Pat. No. 10,144,034, incorporated herein by reference.

Generally, in a laser-based printing system 11, a laser 10 (e.g., a high frequency laser) is used to impart energy to a "tiny spot" (i.e., small area) on a transparent or semi-transparent substrate 12 that is coated with a layer 14 of the material 16. The energy from the laser 10 dislodges a small portion (e.g., droplet) of the material 16, which is then deposited (or printed) onto the component 18.

Figure 2:
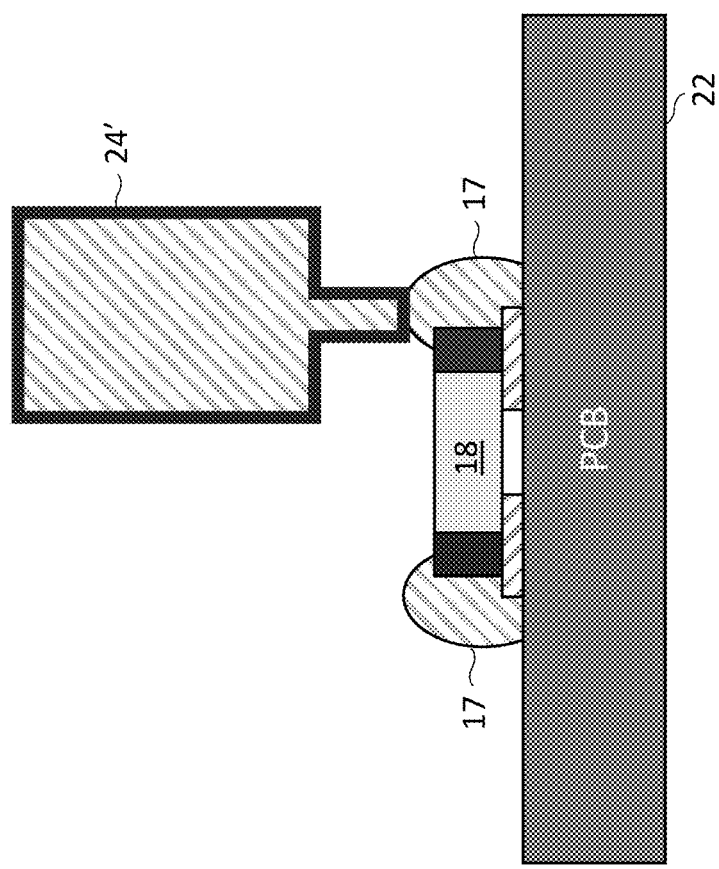
FIG. 2 illustrates an example of incomplete edge covering by conformal materials printed using conventional, low resolution deposition techniques.

As shown in the side view of FIG. 2, conventional, low resolution deposition of conformal coatings 17 (provided by low-resolution dispenser 24') often result in incomplete covering of edges of the component 18. While the side view of FIG. 2 does not clearly show areas of edges 13 that are incompletely covered, it is understood that, in a cross-sectional view, there may be areas of edges 13 that are incompletely covered.

In contrast, the present invention provides very high resolution printing at the edges 13 of components 18, either through laser-assisted deposition, as shown in the laser-based printing system 11 depicted in FIG. 1a, or by use of a conventional high-resolution conformal material dispenser 24 (e.g., an ink jet or other deposition system), as shown in FIG. 1b. Conventional low-resolution dispensers 24' may not be able to penetrate close to a component's edges 13 and, as a result, a thicker conformal coating may be needed to ensure that the edges 13 are adequately coated. To avoid the need for such a thicker coat, laser-induced jetting and/or laser-induced spraying (provided by the laser-based printing system 11) allows the coating material to be transferred at a very high resolution from a relatively high distance above the PCB 22 (e.g., up to several mm) to the edges 13 of the component 18.

Figure 1C:
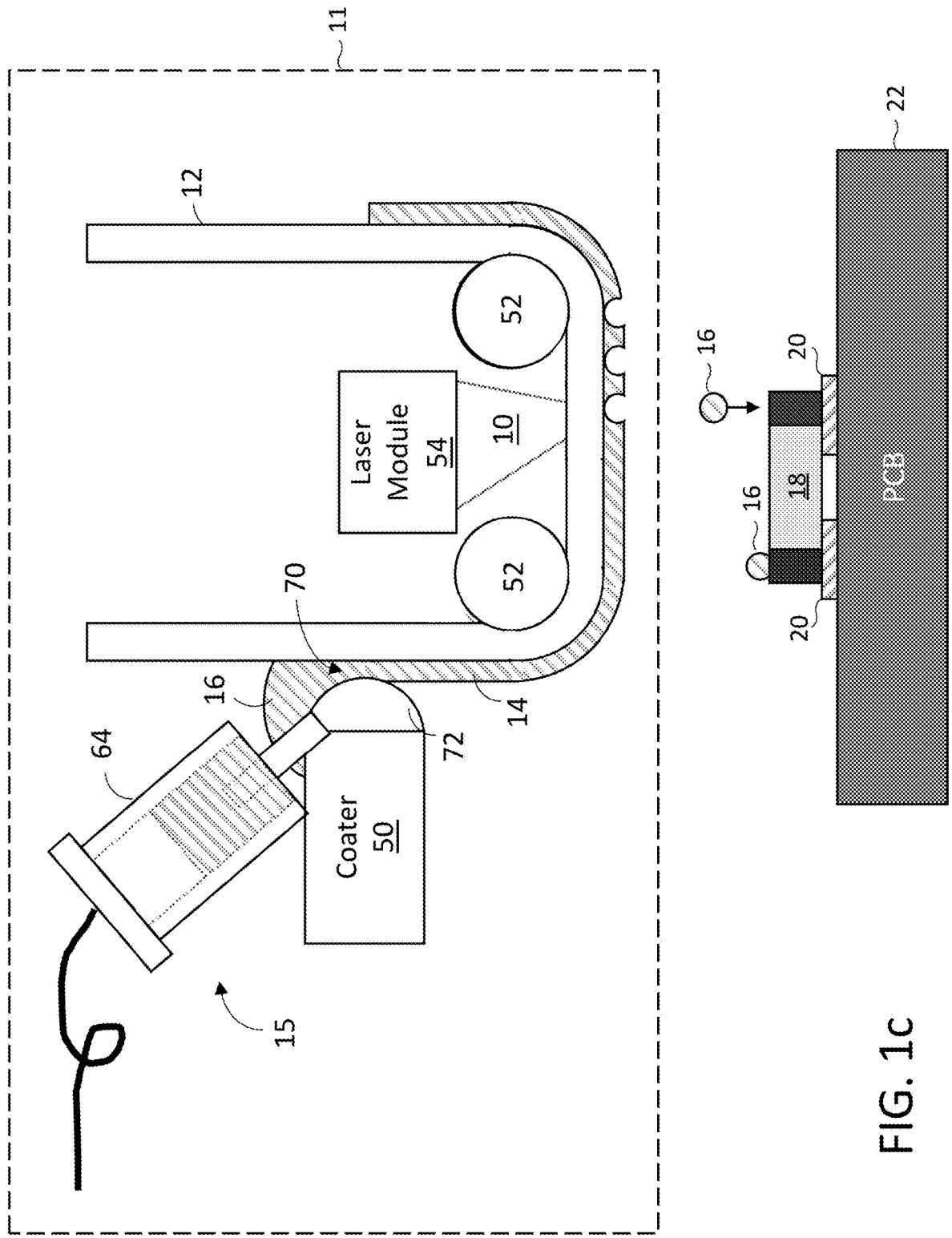
FIG. 1c illustrates aspects of a coating system, in accordance with embodiments of the present invention.

As depicted in FIG. 1a, laser-based printing system 11 may include a coating system 15 for applying a layer 14 of the material 16 with uniform thickness on a transparent or semi-transparent substrate 12. Additional aspects of the coating system 15 are illustrated in FIG. 1c. In one embodiment of the invention, the coating system 15 may include a syringe 64 of the material 16 to be printed and an air or mechanical pump that drives the material 16 onto the substrate 12. The substrate 12 is then moved (e.g., using motors and gears/rollers 66) toward a well-defined gap 70 between rollers or knifes 72 of a coater 50 to remove excess material and create a uniform layer 14 of the material 16 with a thickness that is defined by the gap 70. The material 16 is then transferred from the substrate 12 to the component 18, e.g., using laser-assisted deposition (e.g., using laser 10 of laser module 54 to jet/spray portions of the material 16 from the substrate 12 towards component 18).

In one embodiment of the invention, the coating system 15 includes a screen-printing module wherein the material 16 is coated on a screen or stencil of film with well-defined holes and transferred to the substrate 12 using a blade or a squeegee in a soft or hard engage. In one embodiment of the invention, the coating system 15 includes a dispenser or an ink jet head to print the material 16 directly onto a carrier substrate 12. In one embodiment of the invention, the coating system 15 is a gravure or micro-gravure system that coats a substrate 12 with a highly uniform layer 14, and the material 16 is then transferred from the substrate 12 to the component 18, as described above. In one embodiment of the invention, the coating system 15 is a slot-die system that coats a substrate 12 with a highly uniform layer 14, and the material 16 is then transferred from the substrate 12 to the component 18, as described above. In one embodiment of the invention, the coating system 15 is a roller coating system that coats a substrate 12 with a highly uniform layer 14, and the material 16 is then transferred from the substrate 12 to the component 18, as described above.

In one embodiment of the invention, the coating system 15 is located inside a closed cell with a controlled environment (cold or hot) to prevent evaporation of solvent from the printed material 16 or to prevent material oxidation, thereby prolonging the pot life of the material 16.

In some embodiments of the invention, the coating system 15 contains more than one material, creating a possibility for printing a plurality of materials onto the component 18 in a controlled sequence and making it possible to print more than one material on the component 18.

In one embodiment of the invention, the substrate 12 used to transfer the material 16 to the component 18 may be translated bidirectionally in a controlled manner during the coating process (e.g., while opening the gap between the coater rollers), creating the possibility for recoating the same area of the substrate 12 with the material 16 multiple times without contamination to the rollers. This recoating may reduce or eliminate the amount of substrate 12 consumed during the initial printing process and prevent waste.

In one embodiment of the invention, the printing system may be a laser-based printing system 11 (as depicted in FIG. 1a) that contains a high frequency laser to enable jetting of the coated material 16 from a coated substrate 12 to the component 18 by laser-assisted deposition. Such as system may also be called a laser dispensing system. In one embodiment of the invention, the printing system may be an ink jet head system (not depicted) that enables jetting a material 16 directly to the component 18. In one embodiment of the invention, the printing system may be a dispenser head system (not depicted) that enables printing a material 16 directly to the component 18.

In one embodiment of the invention, a continuous transparent film substrate is used as a substrate 12 for the printing system. That is, the transparent film substrate resembling a thin sheet of material in the configuration of a loop (like an elongated rubber band) may be passed over a series of rollers so that as one part is coated by coating system 15, another part is disposed under the laser module 54 for deposition. Eventually, the portion of the substrate 18 that has been depleted of the coating material 16 will return to coating system 15 to be recoated, and at a later point in time that recoated portion will again be disposed under the laser module 54 for deposition. In one embodiment of the invention, a transparent film substrate 12 coated by a metal layer or by a metal and a dielectric layer is used as a substrate 12 for the printing system, e.g., in the manner described above.

As described in more detail below, the component 18 with the printed material 16 covering one or more of its edges is exposed to UV light or dried by a heater after the first cycle of printing. In some embodiment of the invention, after printing remaining areas of the component 18 in a second printing cycle, the printed material 16 is further cured by UV light or dried by a heater.

Figure 3A:
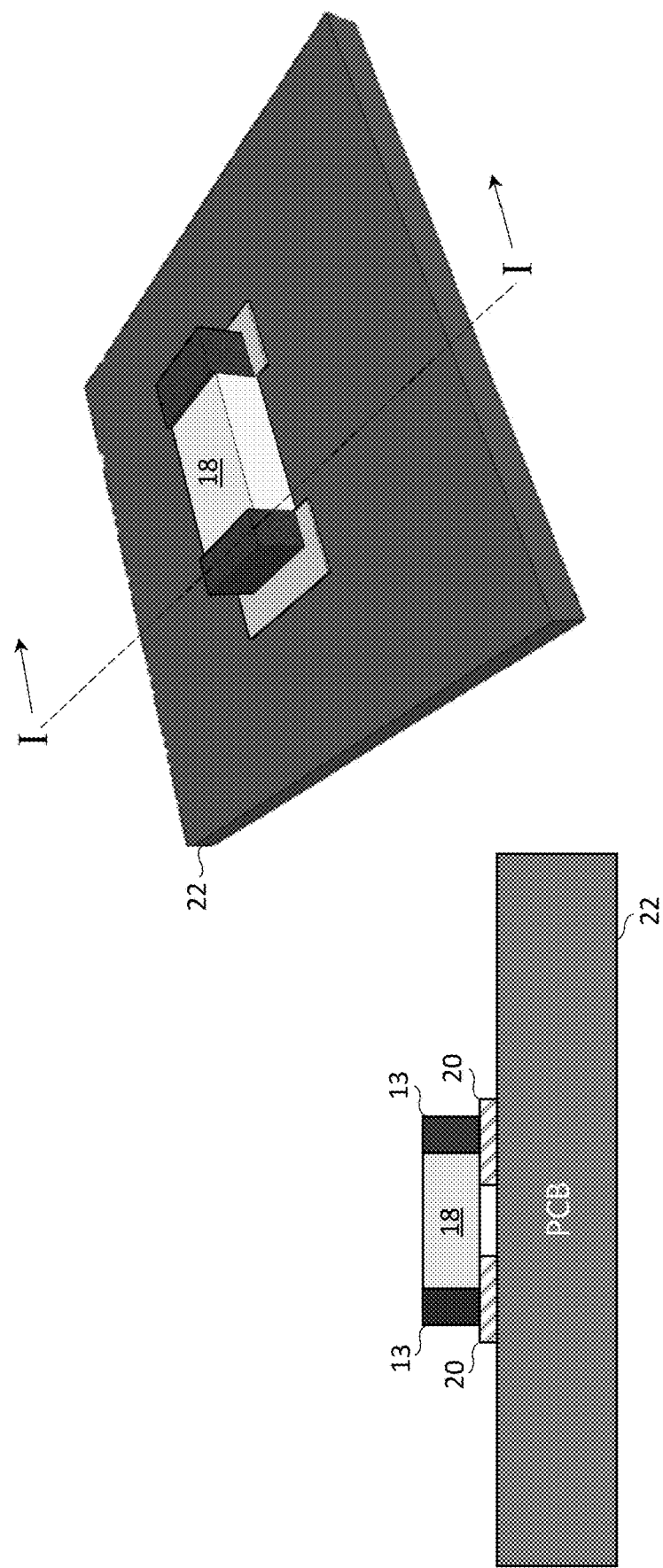

In some embodiments of the invention, the laser-based printing system 11 creates a uniform layer of the printed material on the edge 13 of the component 18, and that material is cured before the remaining portions of the component 18 are coated. For example, FIG. 3a shows cross-sectional and perspective views of a component 18 mounted or otherwise affixed to a PCB 22 with conductive material 20. More specifically, the cross-sectional view in the left portion of FIG. 3a is along cut-line I-I depicted in the perspective view in the right portion of FIG. 3a.

Figure 3B:
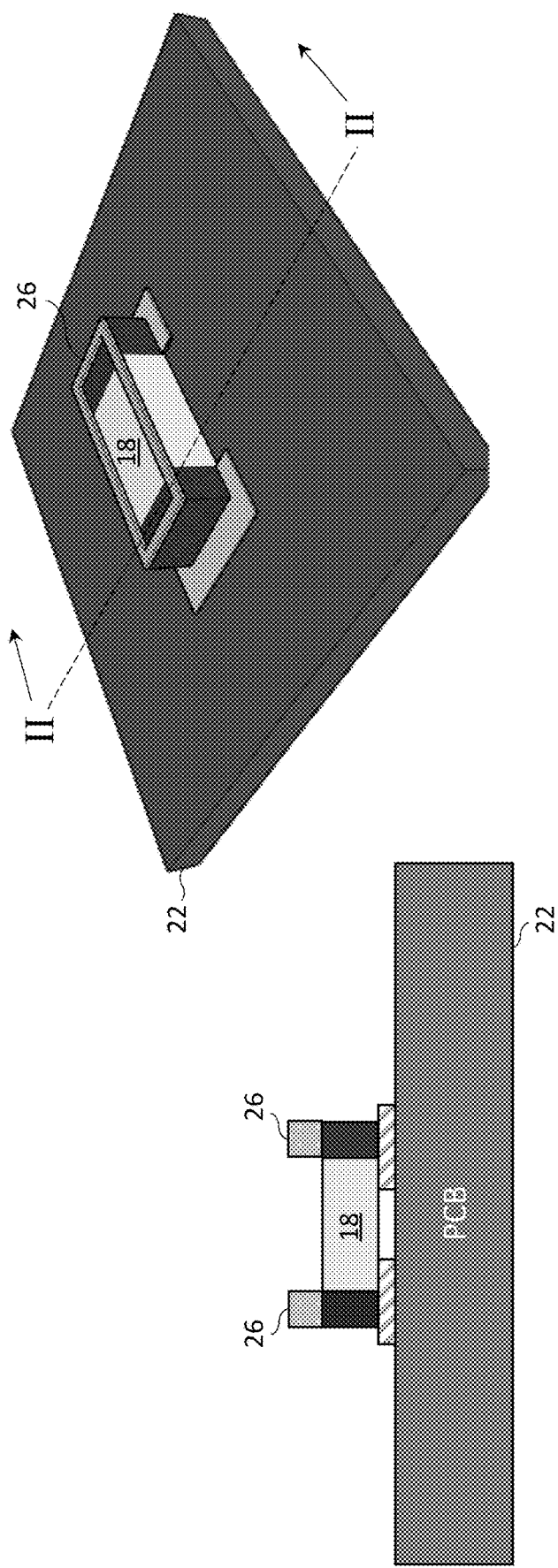

In the cross-sectional and perspective views of FIG. 3b, edges 13 of the component 18 have been coated with a conformal material or other waterproof coating material 26. More specifically, the cross-sectional view in the left portion of FIG. 3b is along cut-line II-II depicted in the perspective view in the right portion of FIG. 3b.

Figure 3C:
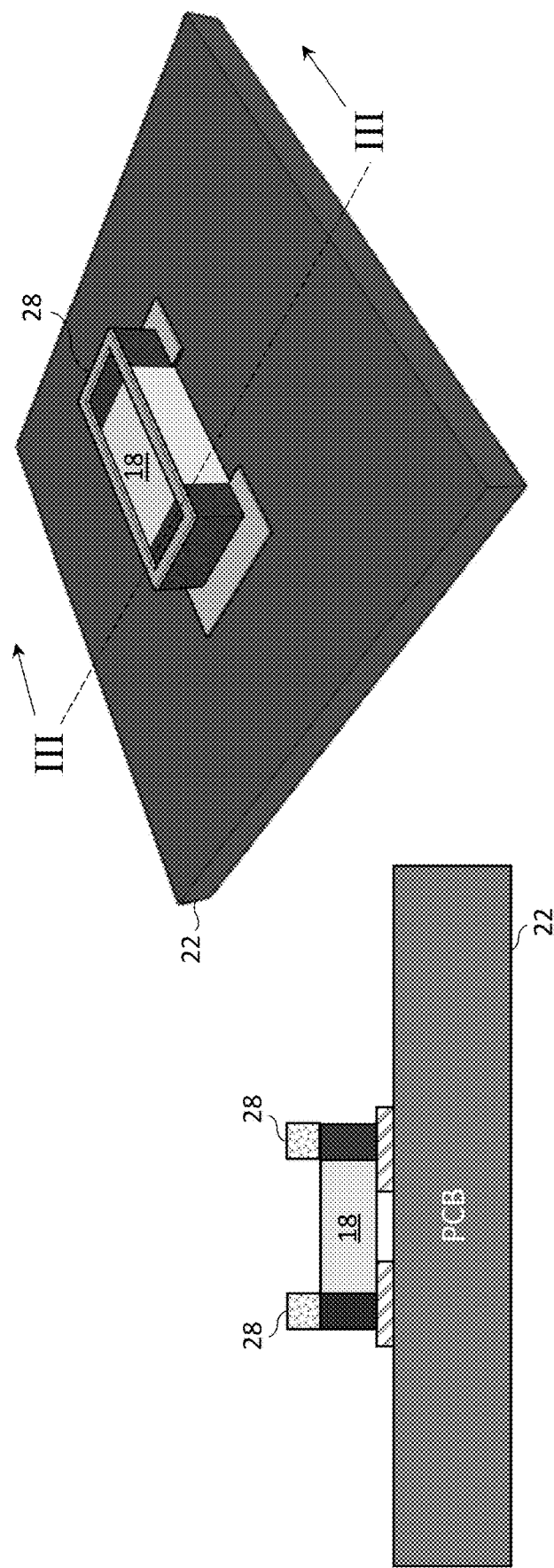

In the cross-sectional and perspective views of FIG. 3c, the material 26 deposited over the edges 13 of the component 18 has been cured into cured material 28, e.g., by heating and/or by exposure to UV radiation (e.g., from a UV source such as one or more UV light emitting diodes (LEDs)). More specifically, the cross-sectional view in the left portion of FIG. 3c is along cut-line depicted in the perspective view in the right portion of FIG. 3c.

Figure 3D:
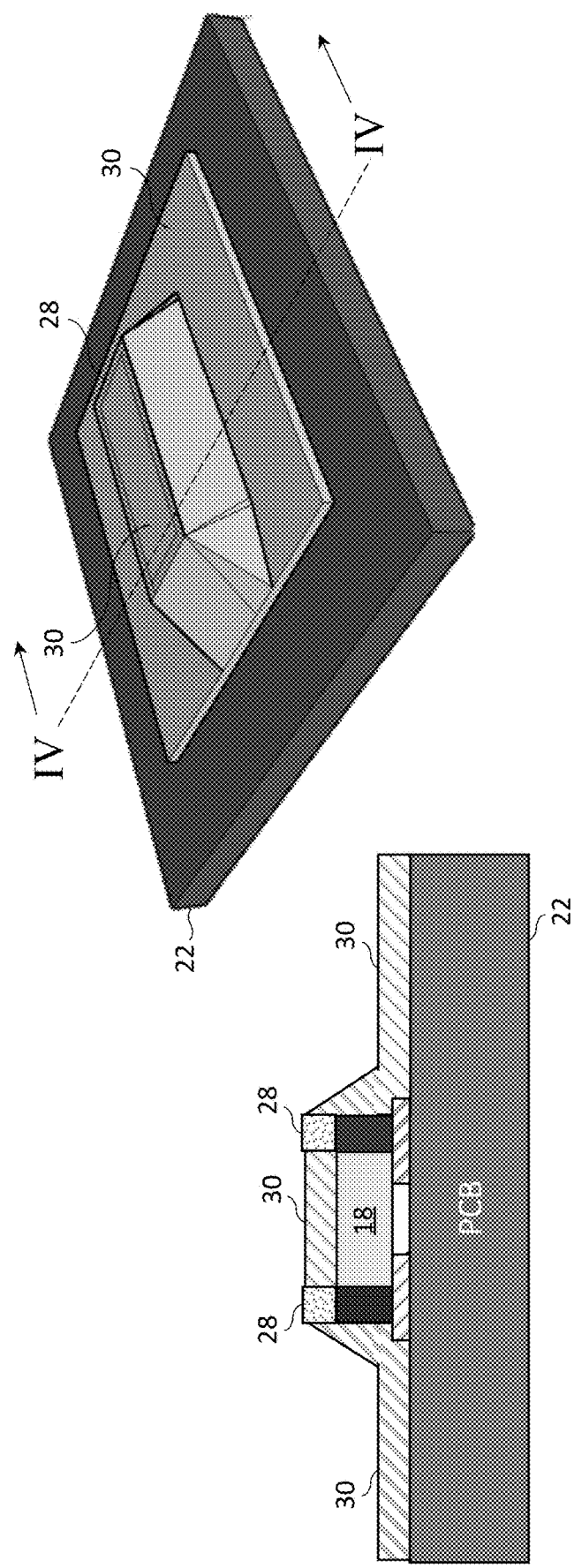

In the cross-sectional and perspective views of FIG. 3d, the remaining portions of the component (along with some portions of a top surface of the PCB 22) have been covered by the conformal material 30 or other waterproof coating material. This deposition of material may be performed using the same laser-based printing system 11 as was used for the edge coatings (or using a different coating system). More specifically, the cross-sectional view in the left portion of FIG. 3d is along cut-line IV-IV depicted in the perspective view in the right portion of FIG. 3d.

Figure 3E:
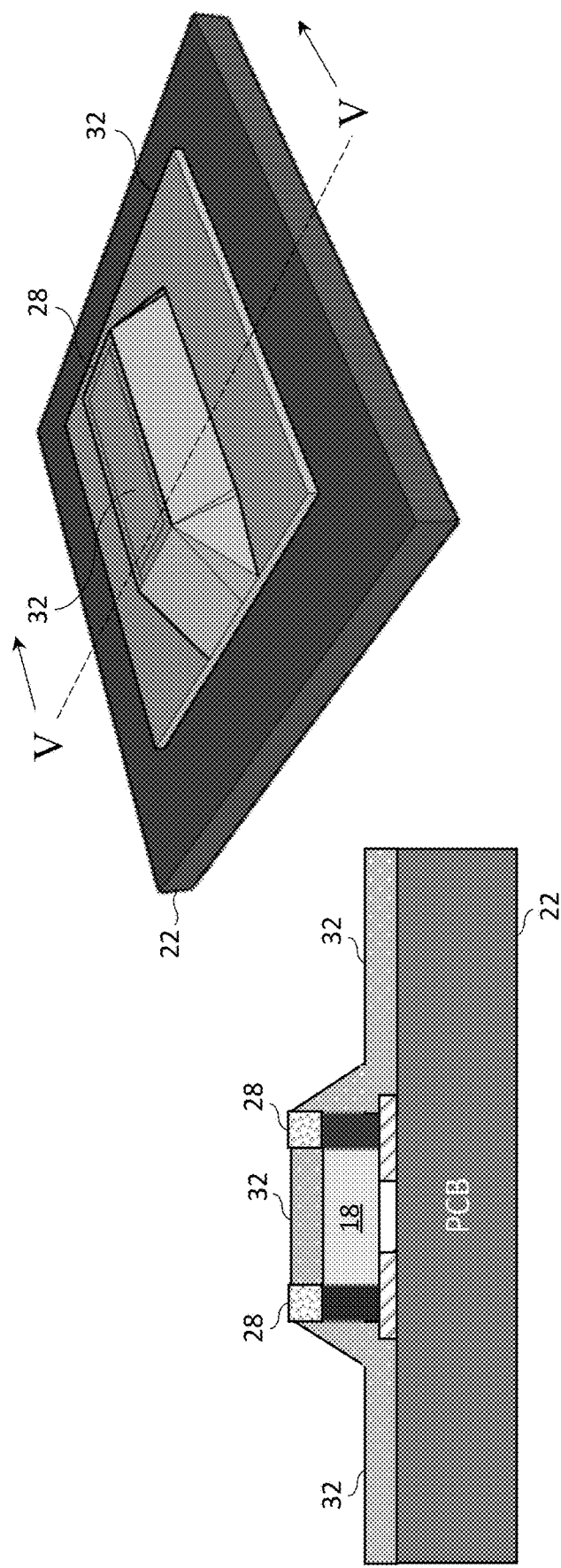

In the cross-sectional and perspective views of FIG. 3e, the material 30 deposited over the remaining portions of the component (along with some portions of the top surface of the PCB 22) has been cured into cured material 32, again either by heating and/or by exposure to UV radiation. More specifically, the cross-sectional view in the left portion of FIG. 3e is along cut-line V-V depicted in the perspective view in the right portion of FIG. 3e.

Referring now to FIGS. 4a-4h, an example of a process of printing conformal materials in accordance with an embodiment of the present invention is described. In the side and top views of FIG. 4a, a transparent or semi-transparent substrate 12 has been coated with a material 16 (e.g., a polymeric material) or other waterproof coating material, that is to be applied as a conformal coating to a component 18 located on a printed circuit board (PCB) 22. The material 16 to be printed may be applied to the transparent or semi-transparent substrate 12 in any of the manners described above. Once so applied, the substrate 12 with the coated layer 14 of material is brought into proximity of the component 18 with a laser printing head (depicted later in FIG. 6a), and the laser 10 is operated (e.g., in a pulsed fashion) to jet droplets of the material 16 from the coated substrate 12 onto the edges 13 of the component 18. In the view at right, a top view of the component 18 on the PCB 22 is shown, with printed droplets of the waterproof coating material 16 around the edges of the component 18.

The volume of the droplets so printed may be determined by the energy of the laser 10 used for the jetting process, the thickness of the film 14 of material coated on the transparent or semi-transparent substrate 12, or a combination of these parameters. In general, the size of the printed droplet on the component 18 will be determined by its volume and the vertical distance between the coated substrate 12 and the surface on which the droplets are printed. By controlling these parameters (e.g., by varying the thickness of the coated layer 14, controlling the pulse width, pulse frequency, and/or number of pulses of the laser 10, and the spacing of the distance between the coated substrate 12 and the surface on which the droplets are printed), droplets of a desired size can be printed on the component 18. Preferably, the droplet volume is controlled so as to ensure an even distribution of the coating material 16 on the component 18. This may be easiest with droplets of common volume throughout the jetting process, but in some cases the droplet volume may be varied during the jetting process, for example, when component features demand or would benefit from the application of droplets of different volumes.

Figure 4A:
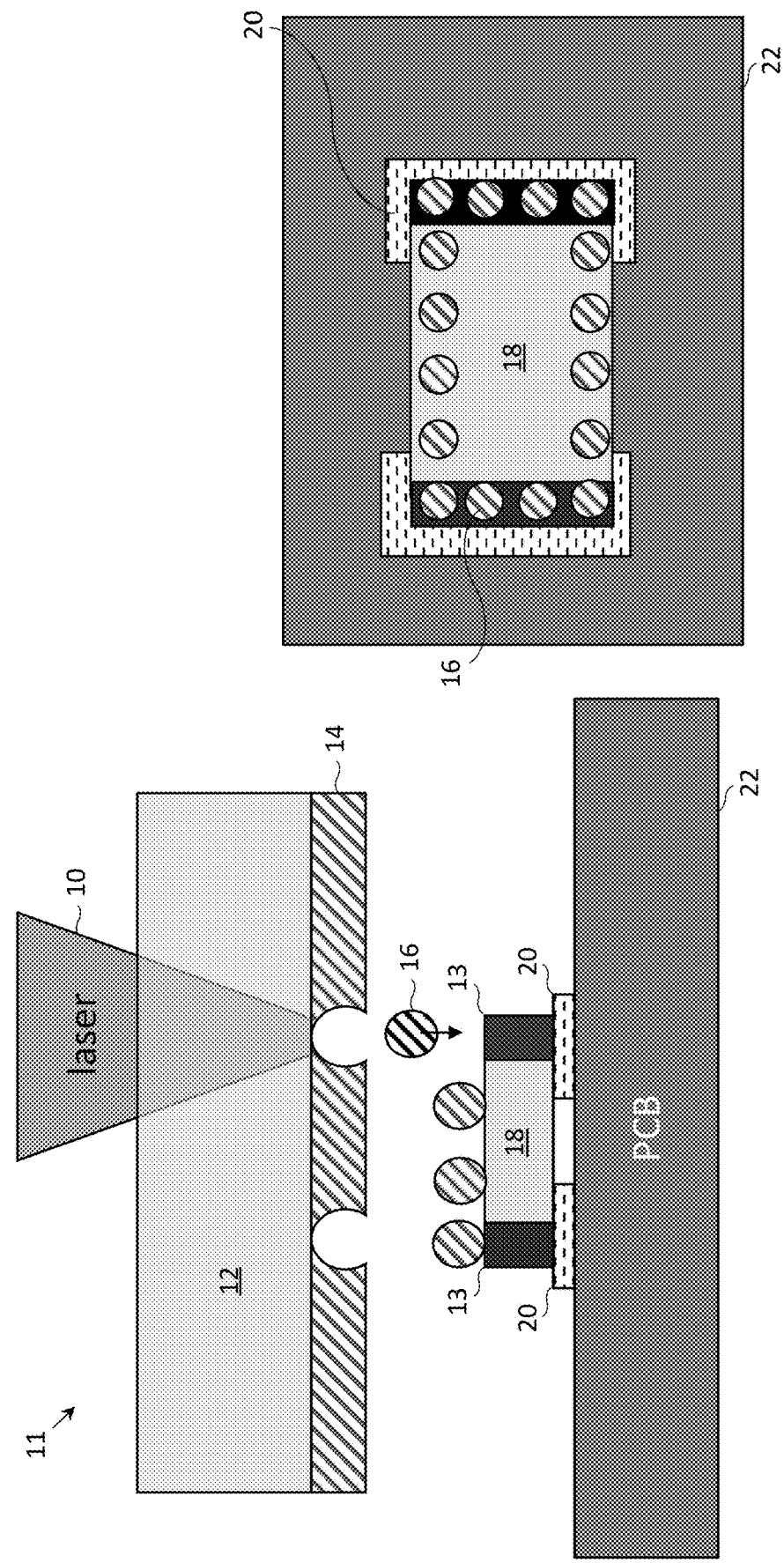
FIGS. 4a-4i illustrate steps in a process of printing conformal materials, in accordance with an embodiment of the present invention.
Figure 4B:
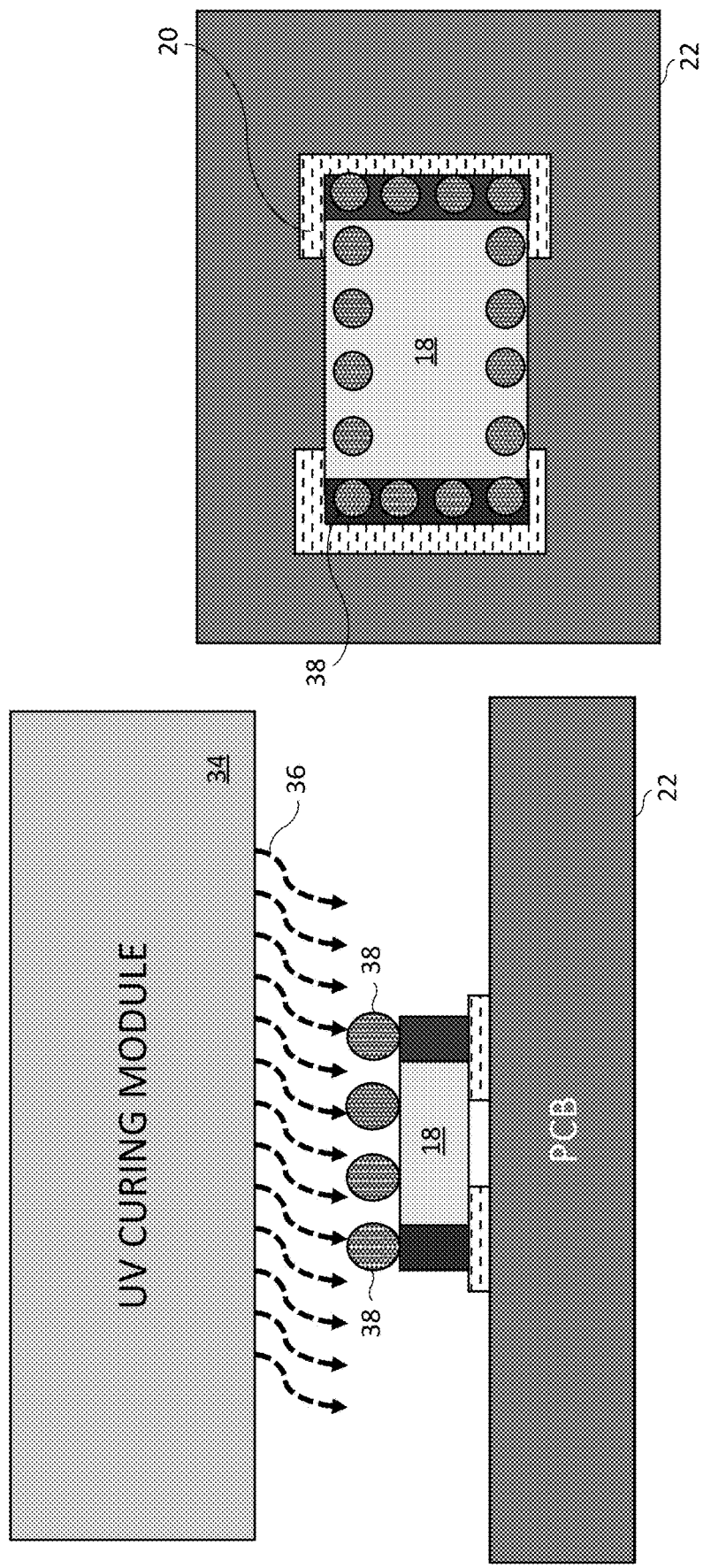
Figure 4C:
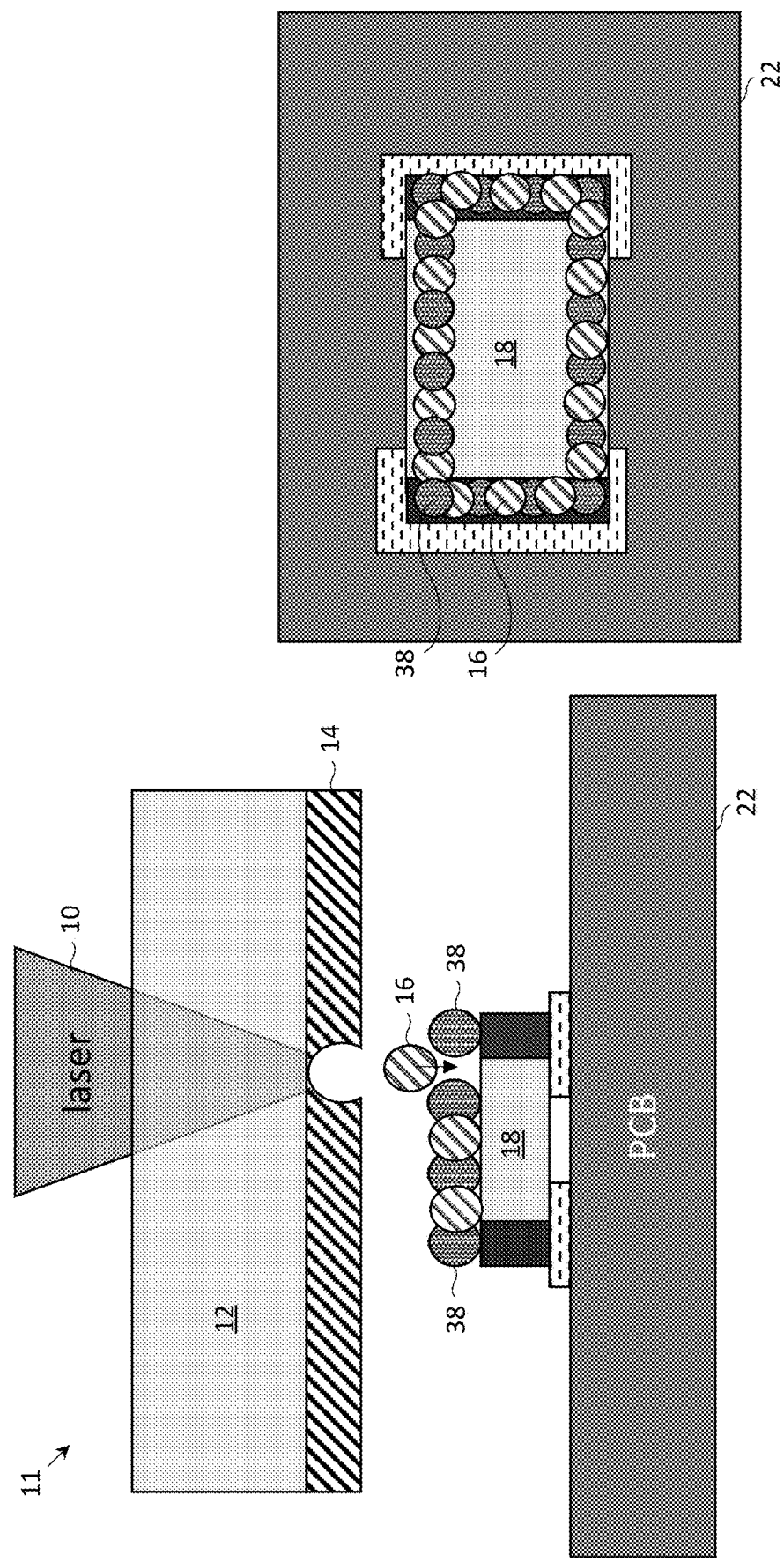
Figure 4D:
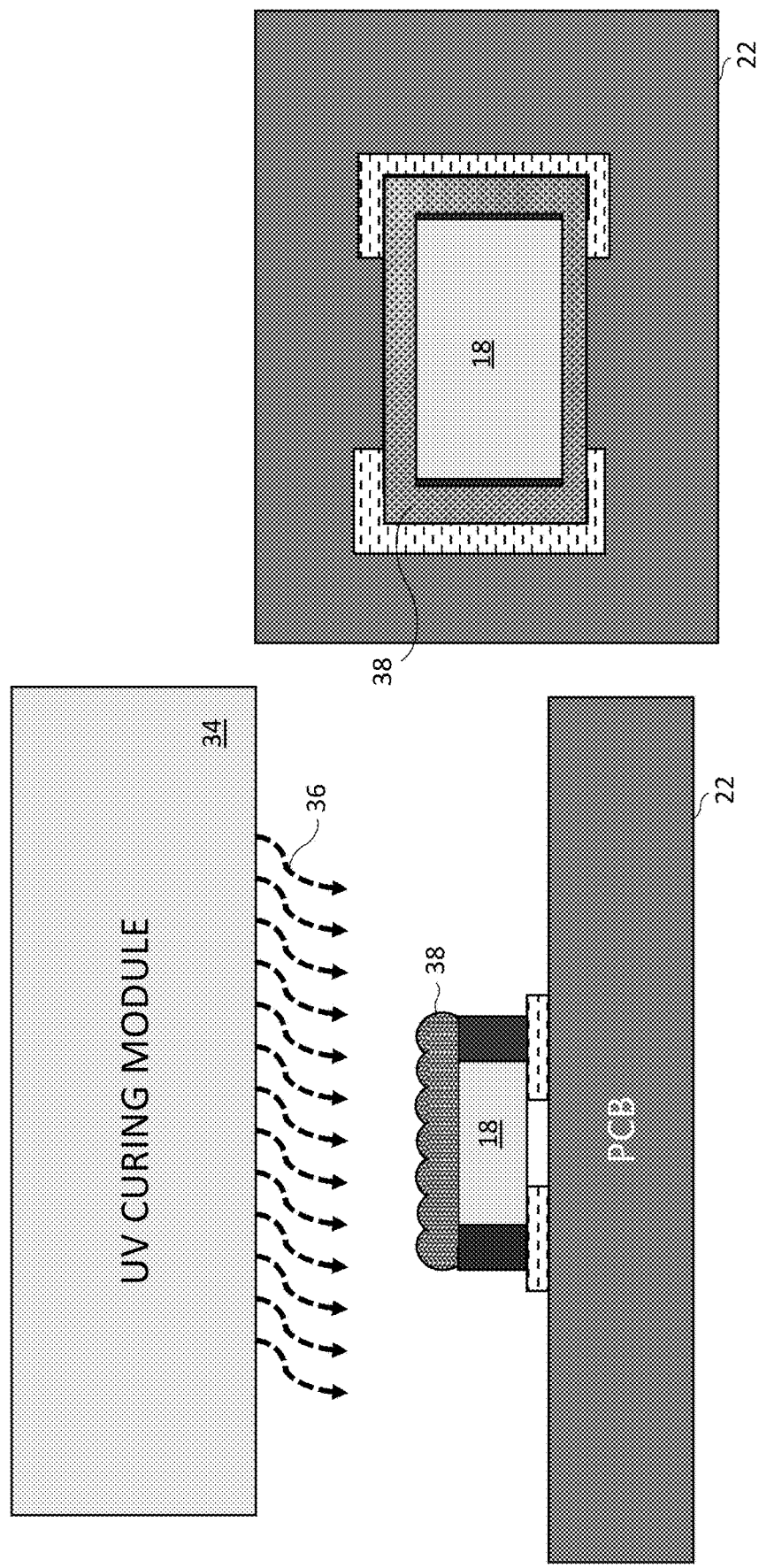
Figure 4E:
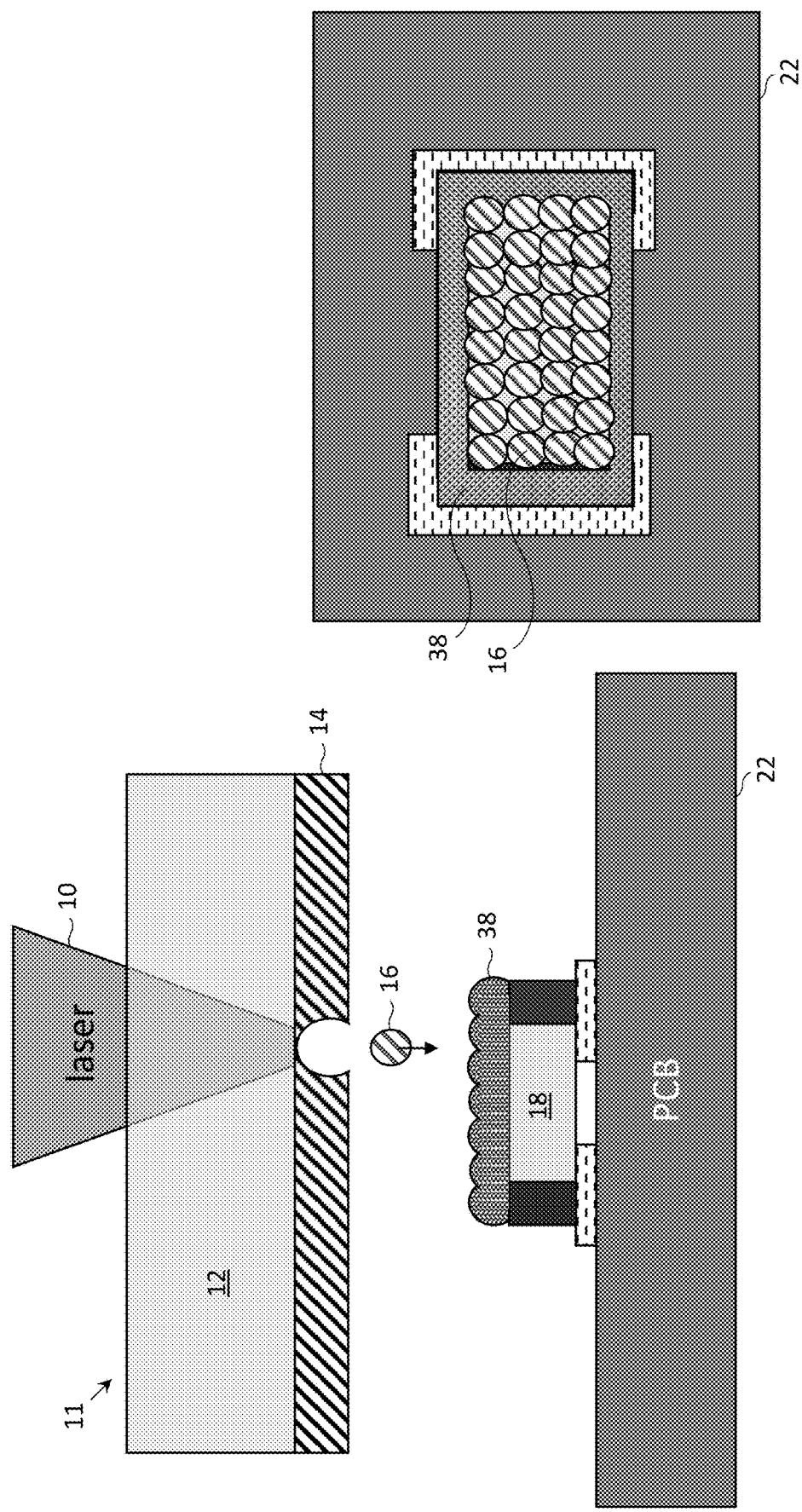
Figure 4F:
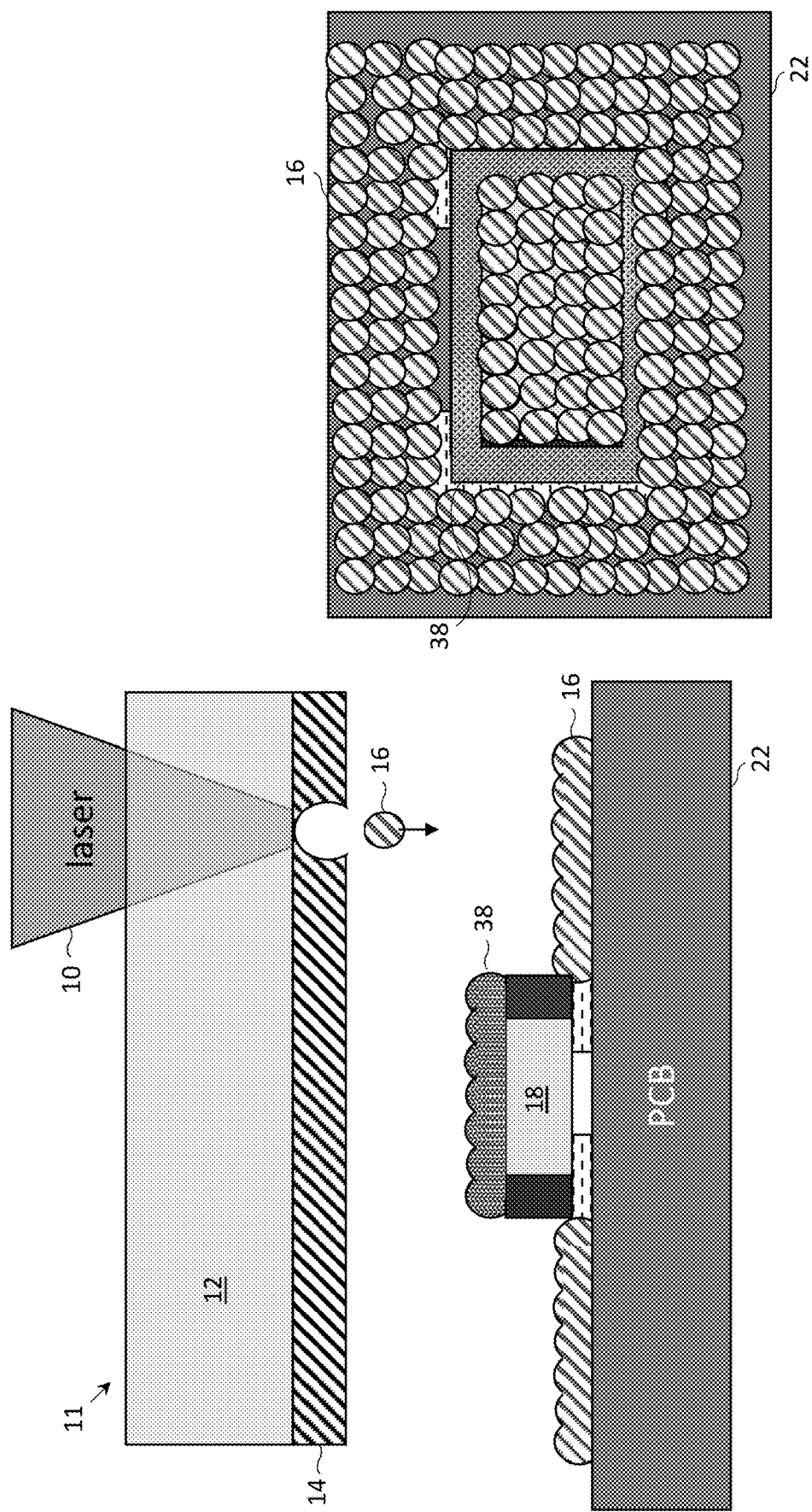
Figure 4G:
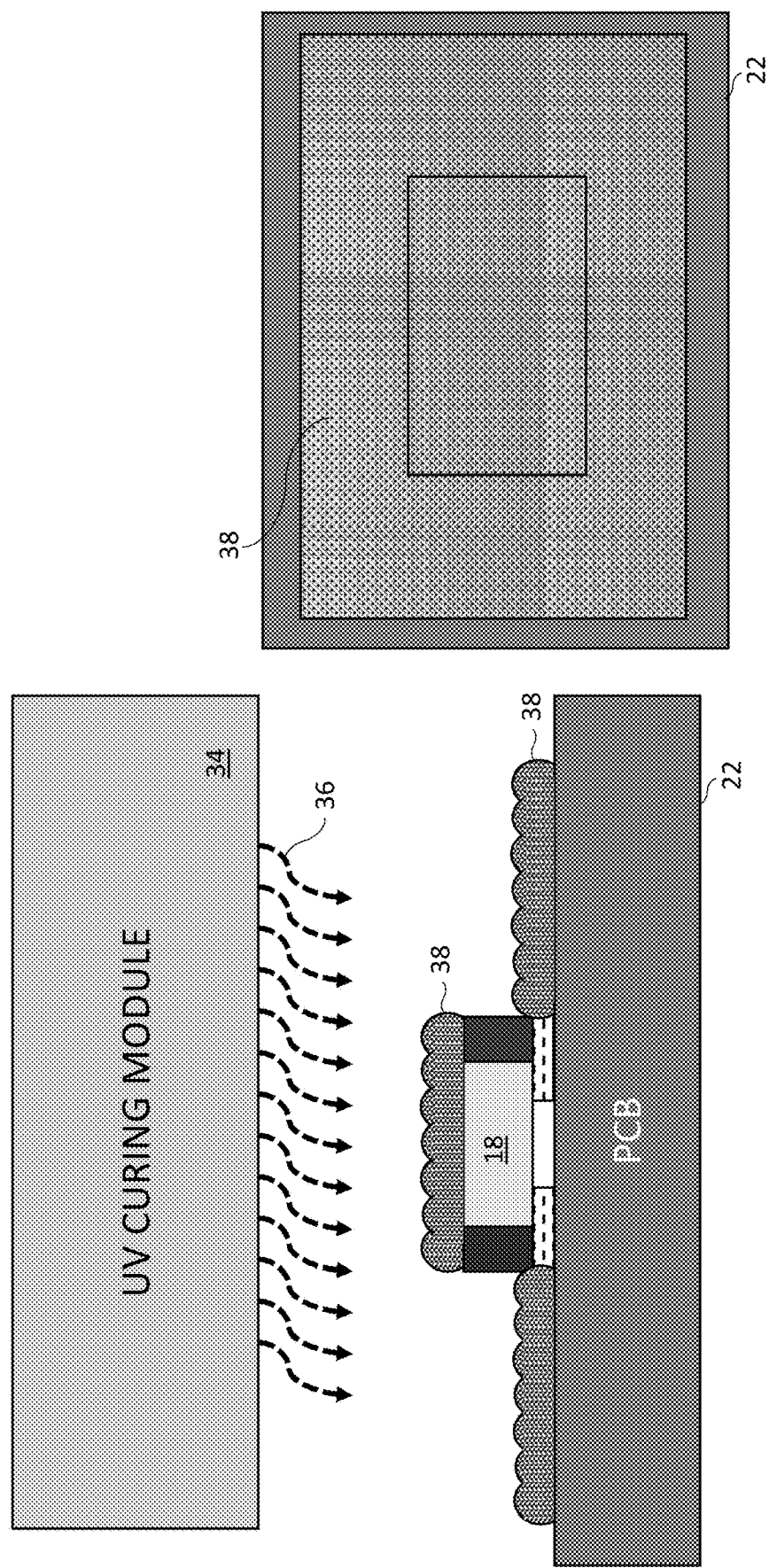
Figure 4H:
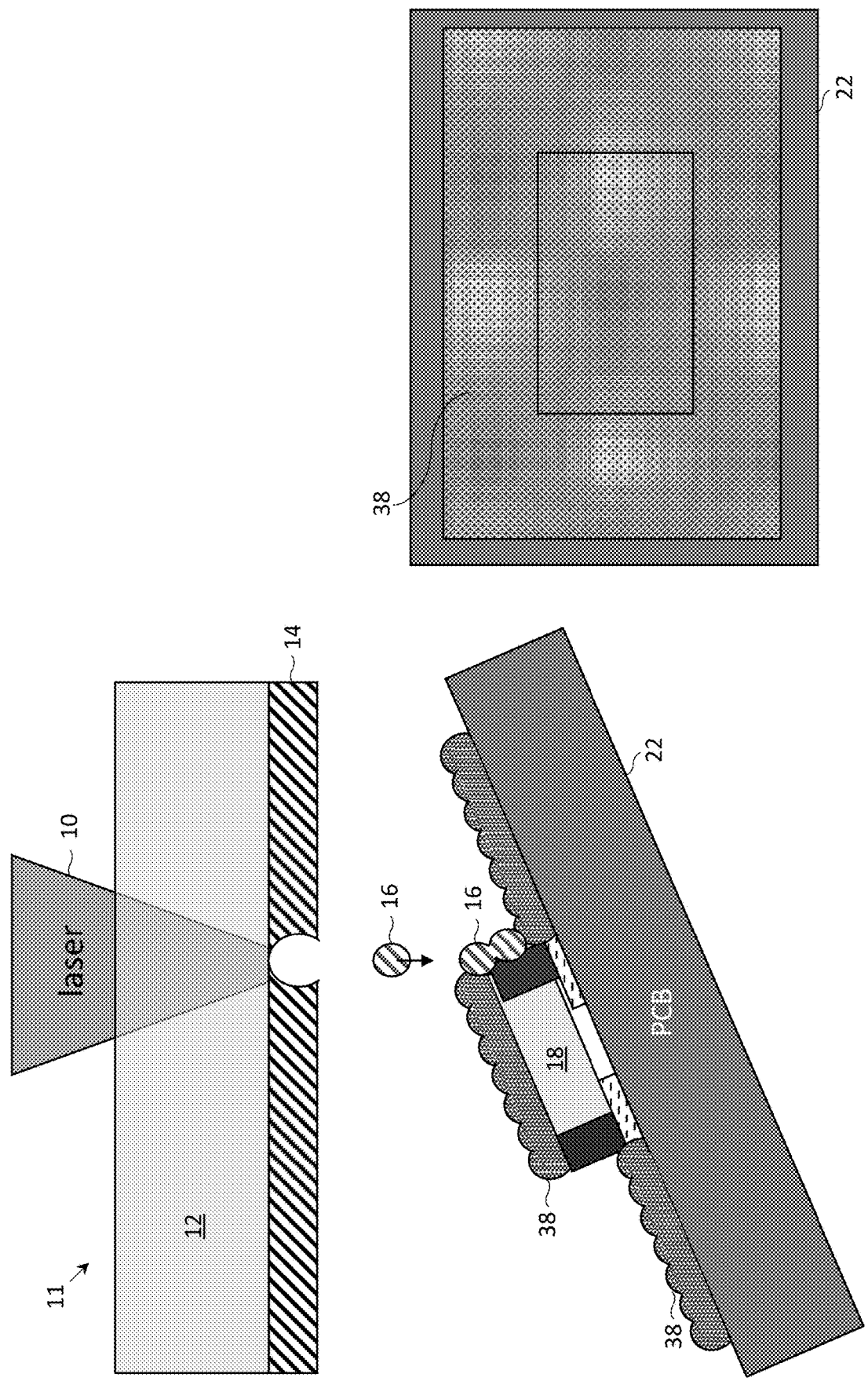
Figure 4I:
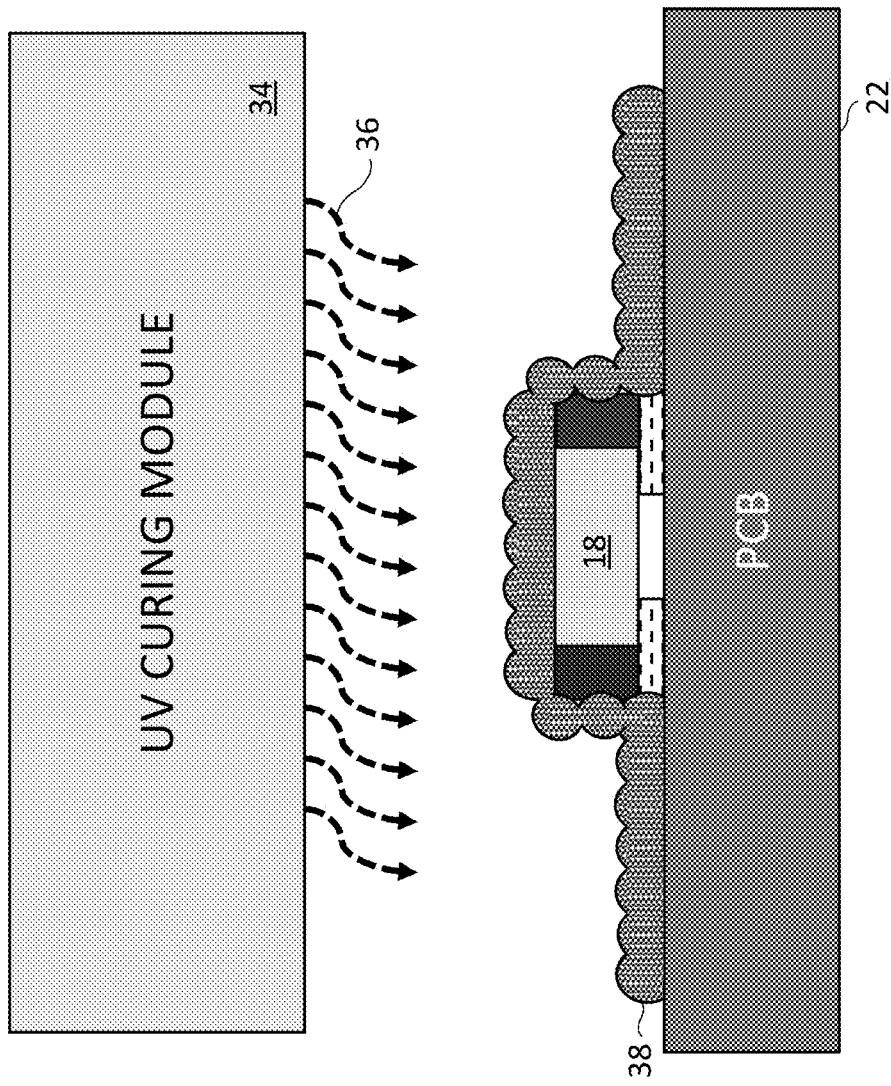
Figure 5:
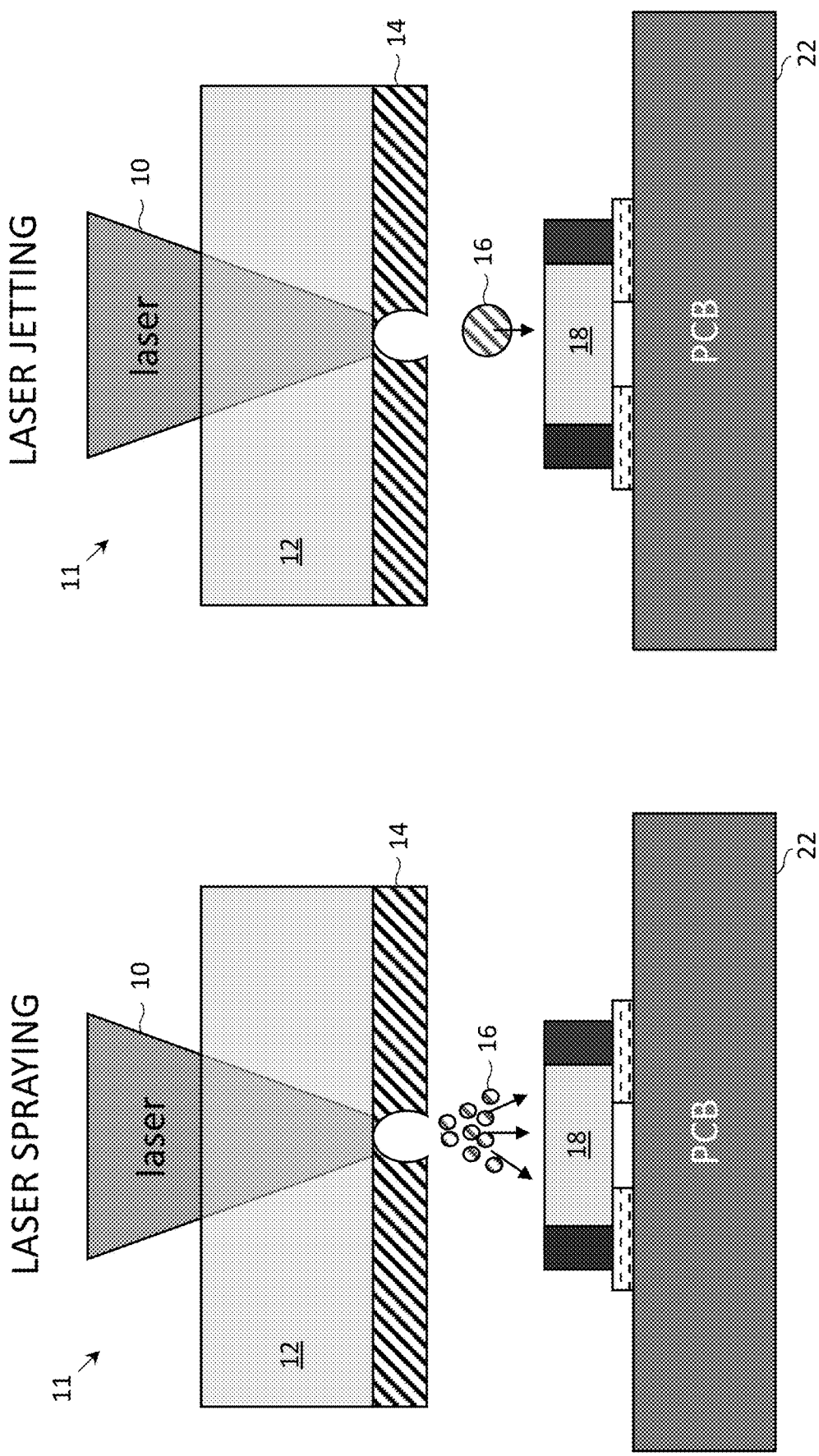
FIG. 5 illustrates aspects of laser induced spraying versus laser induced jetting, either or both of which techniques may be employed in processes for printing conformal materials, in accordance with an embodiment of the present invention.

Referring briefly to FIG. 5, in the present discussion and in the illustrations of FIGS. 4a-4i, laser-induced jetting is assumed. However, in some embodiments, laser induced spraying of the material 16 from the coated substrate 12 may be used. With laser-induced spraying, a plurality of small droplets of the material 16 (versus a single, larger volume droplet as is produced in laser-induced jetting) are scattered from the coated substrate 12 towards the component 18 on the PCB 22. Spraying in this fashion may be desirable in some instances. In some cases, a waterproof coating material 16 may be applied to a single component 18 and/or its associated PCB 22 using either or both of laser-inducted jetting and laser-induced spraying. For example, laser-induced spraying may be employed when the waterproof coating material 16 is applied to the edges 13 of the component 18, while laser-induced jetting may be employed when the waterproof coating material 16 is applied elsewhere on the component 18 and/or the PCB 22. Jetting versus spraying of a waterproof coating material 16 may be controlled or selected through variation of the pulse width, spot size, spot shape, pulse frequency, and/or number of pulses of the laser 10, the thickness of the layer 14 of coated material 16 on the transparent or semi-transparent substrate 12, or a combination of these parameters. Therefore, throughout the present discussion, reference to laser-induced jetting, or illustration thereof, should be understood as including the possibility of using laser-induced jetting alone, laser-induced spraying alone, or a combination of laser-induced jetting and laser-induced spraying both in a single process step or between process steps.

Returning to FIG. 4a, once the edge or perimeter (or a desired portion of the perimeter) of the component 18 has been coated with the droplets of the waterproof coating material 16, these droplets may be cured into cured droplets 38, as shown in the side and top views of FIG. 4b. In some embodiments, the curing may be performed via photopolymerization of the coated material using ultraviolet (UV) light 36 provided by a UV curing module 34. Alternatively, or in addition, curing may be performed using thermal radiation (heat), for example by placing the component 18 and PCB 22 in an oven or under one or more heating (e.g., infrared) lamps, and/or using hot air flow from a blower. Still further, in some instances, curing may be effected chemically, or by other means. This curing step following the application of the waterproof coating material 16 to the edges 13 of the component 18 is preferred, but is optional. Employing such a curing step has been found to enhance the overall conformal coating process. However, the use of such a curing step does increase the overall time to complete the coating process, so, in some cases, such curing step may be omitted in the interest of reduced overall process time.

Following the curing of the waterproof coating material being applied to the edges 13 of the component 18 (if such a step is employed), the component 18 and PCB 22 are returned to the vicinity of the laser printing head (depicted later in FIG. 6a) and, as shown in the side and top views of FIG. 4c, any gaps in the coated edge areas 13 of the component 18 are printed in the same fashion as discussed above. That is, the substrate 12 with the coated layer 14 of waterproof material 16 is brought into proximity of the laser printing head, and the laser 10 is operated (e.g., in a pulsed fashion) to jet droplets of the material 16 from the coated substrate 12 onto the edges 13 of the component 18 to fill in any gaps in coverage from the first printing step, and/or to apply an additional coat of the waterproof material 16 to the edges 13 of the component 18. Then, as shown in the side and top views of FIG. 4d, another optional curing step may be employed to solidify (or cure) these newly printed droplets of the waterproof material 16 into a layer of cured material 38 over the edge 13 of the component 18.

Figure 6A:
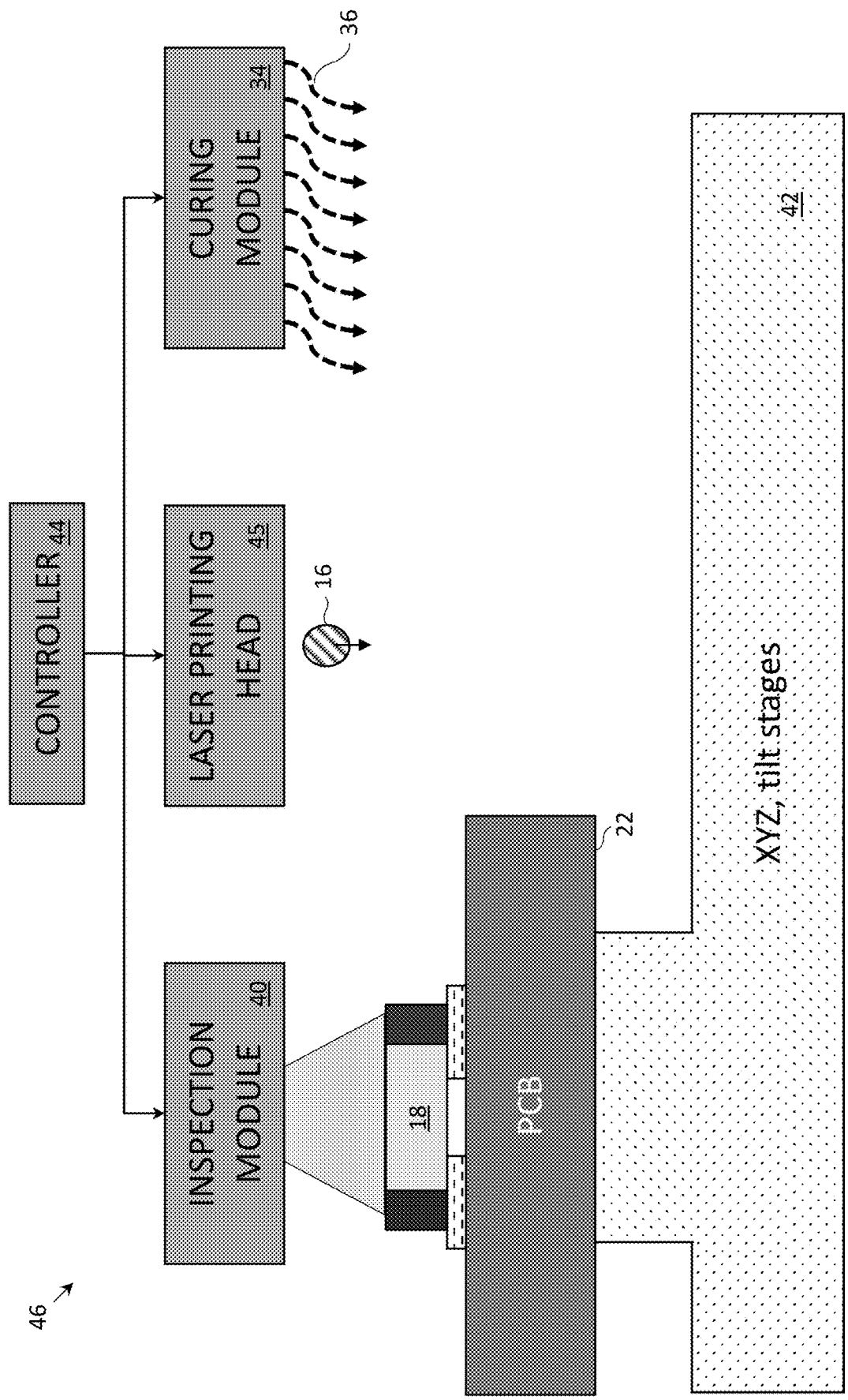
FIG. 6a illustrates aspects of a system for printing conformal materials, in accordance with an embodiment of the present invention.

Referring to FIG. 6a, a block diagram of a system 46 configured for printing conformal materials in accordance with an embodiment of the present invention is shown. As illustrated, the component 18 and PCB 22 may be located on a moveable stage 42 (e.g., moveable in three dimensions) so as to be positionable and relocatable between the laser printing head 45 and the curing module 34. It is understood that laser printing head 45 may include the previously-described laser 10, substrate 12 and layer 14, in addition to mechanical components (e.g., tracks, motors, etc.) which allow the printing head 45 to be translated in the XYZ dimensions with respect to the component 18 during the printing steps/operations.

By being adjustable in three dimensions, the stage 42 can translate the component 18 and PCB 22 between the laser printing head 45 and curing module 34, and also adjust the displacements between and with respect to the printing head 45 and the component 18, and between the curing module 34 and the component 18. In addition, an inspection module 40 may be included in the system 46, and the stage 42 may be operable to position the component 18 and PCB 22 under the inspection module 40 prior to and between the printing and curing steps. For example, prior to a printing step, the component 18 and PCB 22 can be inspected to aid in alignment of the printing head 45 with respect to the component 18 and PCB 22. Following a printing and/or curing step, the component 18 and PCB 22 can be inspected to determine whether any repair of a prior printing step is needed.

The inspection module 40 may be configured to image and/or to measure the topography of the component 18 and PCB 22 and/or may include optical components to permit real-time inspection by machine and/or human operators. The optical or other imaging inspection may reveal that while many of the droplets have been suitably printed on the component 18 and/or PCB 22, some of the droplets are out of position or are otherwise unsuitable. A controller 44 having access to this data may then operate the system 46 so as to remediate the situation (e.g., removing improperly printed material and having it reprinted, or having additional droplets printed to cover a gap, etc.). Imaging may be performed before and/or after the material transfer by the laser printing head 45 and may capture intermediate images during a printing step.

Figure 6B:
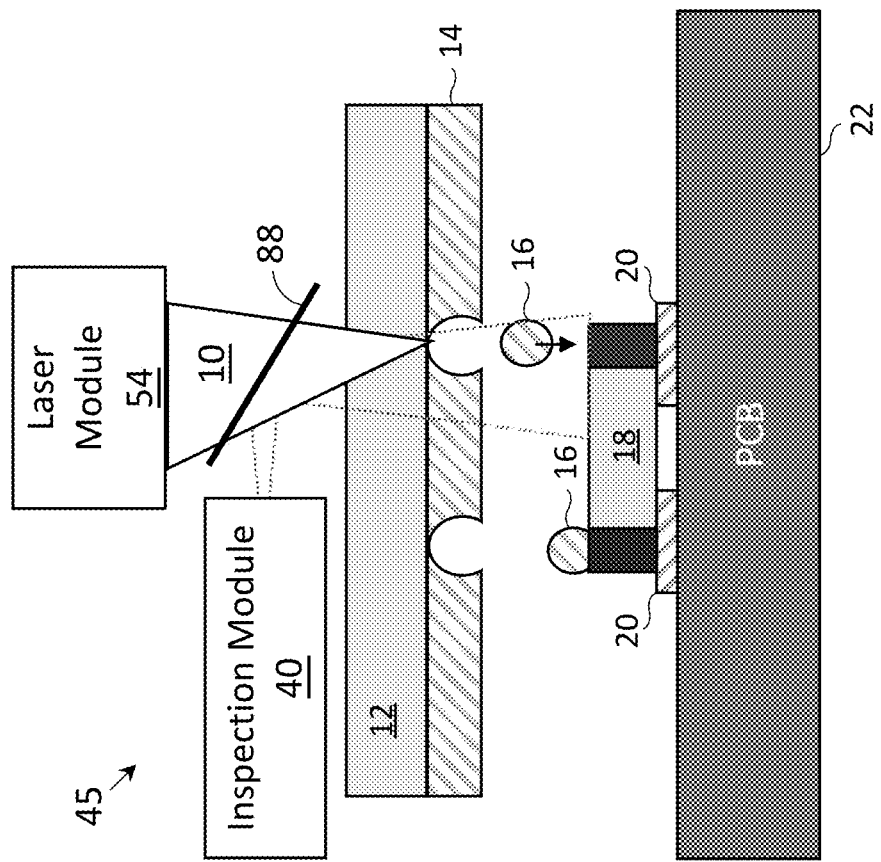
FIG. 6b illustrates aspects of an in-line inspection module, in accordance with an embodiment of the present invention.

In one embodiment of the invention, as depicted in FIG. 6b, the inspection module 40 is positioned coincident with the printing head 45 and a mirror 88 or other optical element (not depicted) may be employed to obtain images of the surface of the component 18 and/or PCB 22 during the jetting of the waterproof material 16. That is, the printing head 45 may include a laser module 54 with an in-line inspection module 40. As the coated substrate 12 and/or component 18 is/are moved to a target area in the vicinity of the laser printing head 45, the laser module 54 is activated to emit a laser beam 10 incident on the coated substrate 12 in order to deliver the waterproof material 16 to the component 18. The images of the surface of the component 18

(obtained from the inspection module 40) may be used to assist in alignment of the component 18 in the target printing area via the stage 42, as well as to help synchronize the pulsing of the laser module 54. In some embodiments of the invention, the laser module 54 of the printing head 45 may be configured to scan the laser beam 10 in a raster-like pattern over the coated substrate 12, releasing droplets of waterproof material 16 onto the component 18. As indicated above, UV curing and/or drying can be performed after the material 16 has been printed on the component 18.

Now referring to the side and top views of FIG. 4e, once the printing of the waterproof material 16 at the edges 13 of the component 18 has been completed, and that material 16 has been cured (if so desired), printing of the material 16 at other areas may commence. As shown, this entails jetting (and/or spraying) droplets of the waterproof material 16 from the coated substrate 12 to other areas of the component 18 that have not been previously printed. In this example, the waterproof material 16 is applied to the top surface of the component 18 (e.g., top surface excluding the perimeter of the top surface). As indicated above, the volume of the droplets so printed may be determined by the energy of the laser 10 used for the jetting process, the thickness of the film 14 of material coated on the transparent or semi-transparent substrate 12, or a combination of these parameters. Preferably, the droplet volume is controlled so as to ensure even distribution of the coating material 16 on the component 18. This may be easiest with droplets of common volume throughout the jetting process, but in some cases, the droplet volume may be varied during the jetting process, for example, when component features demand or would benefit from the application of droplets of different volumes. The volume of the droplets printed during this part of the procedure may be the same as, larger than, or less than the droplets printed during application of the waterproof material to the edges 13 of the component 18.

As shown in the side and top views of FIG. 4f, the printing process continues with droplets of the waterproof material 16 being applied (e.g., by laser-induced jetting, laser-induced spraying, or both) to the areas of the PCB 22 surrounding the component 18. The volume of the droplets printed during this part of the procedure may be the same as, larger than, or less than the droplets printed during application of the waterproof material to the edges 13 of the component 18 and/or other areas of the component 18. As discussed above, during this printing process, the component 18 and PCB 22 may be inspected so as to ensure all desired areas of the component 18 and PCB 22 are being coated with the waterproof material 16. This printing step is followed, as shown in the side and top views of FIG. 4g, by a curing step during which the newly printed droplets on the component 18 and PCB 22 are cured by exposure to UV light 36, heat, or both to form cured layers 38 of the material.

Optionally, an additional printing step may be performed as shown in the side and top views of FIG. 4h. In this step, the component 18 and PCB 22 are tilted with respect to the plane of the coated substrate 12 so as to allow for application of droplets of the waterproof material (by laser-induced jetting, laser-induced spraying, or both) to areas of the component 18 and/or PCB 22 that may have been missed during one of the previous printing steps or which may have received a coating of less than a desired thickness. Such areas may include sharp corners, such as where the component 18 and PCB 22 are in close proximity to one another, or may include areas that may have been fully or partially masked by other portions of the component 18 or another component (not depicted) on the PCB 22 during one of the earlier printing steps. In the illustrated example, the component 18 and PCB 22 are tilted with respect to the plane of the coated substrate 12 (e.g., using a stage that can be rotated about central point), but the reverse is also possible with the plane of the coated substrate 12 and the laser module 54 being tilted with respect to the component 18 and PCB 22. Printing in this fashion, with the component 18 and PCB 22 tilted with respect to the coated substrate 12, can be used in any of above-described printing steps as well. In such a titled arrangement, the bottom surface of the coated substrate 12 may form an acute angle with respect to the top surface of the component 18 and/or PCB 22.

This optional printing step is followed, as shown in the side view of FIG. 4i, by a curing step during which the newly printed droplets on the component 18 and/or PCB 22 are cured by exposure to UV light 36, heat, or both.

As is apparent from the foregoing discussion, aspects of the present invention involve the use of various computer systems and computer readable storage media having computer-readable instructions stored thereon. For example, the processes described in the various figures may be performed by a processor of the controller 44 executing a sequence of instructions that cause the processor to control inspection module 40, laser printing head 45 and curing module 34 in accordance with the processes described above.

Figure 7:
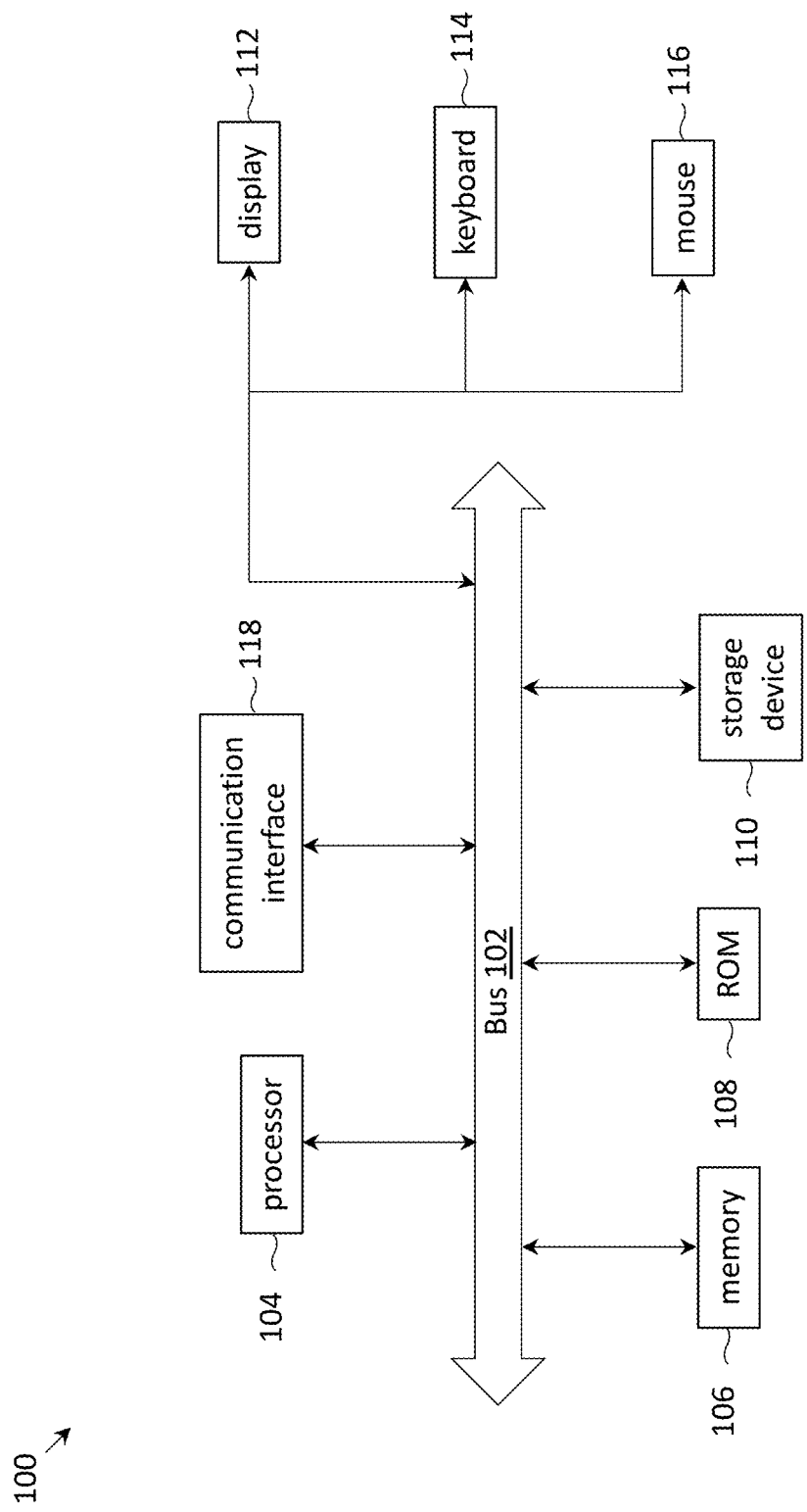
FIG. 7 depicts components of a computer system in which computer readable instructions instantiating the methods of the present invention may be stored and executed.

FIG. 7 provides an example of system 100 that may be representative of any of the computing systems (e.g., controller 44) discussed herein. Note, not all of the various computer systems have all of the features of system 100. For example, certain ones of the computer systems discussed above may not include a display inasmuch as the display function may be provided by a client computer communicatively coupled to the computer system or a display function may be unnecessary. Such details are not critical to the present invention.

System 100 includes a bus 102 or other communication mechanism for communicating information, and a processor 104 (e.g., a microcontroller, an ASIC, a CPU, etc.) coupled with the bus 102 for processing information. Computer system 100 also includes a main memory 106, such as a random access memory (RAM) or other dynamic storage device, coupled to the bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to the bus 102 for storing static information and instructions for the processor 104. A storage device 110, for example a hard disk, flash memory-based storage medium, or other storage medium from which processor 104 can read, is provided and coupled to the bus 102 for storing information and instructions (e.g., operating systems, applications programs and the like).

Computer system 100 may be coupled via the bus 102 to a display 112, such as a flat panel display, for displaying information to a computer user. An input device 114, such as a keyboard including alphanumeric and other keys, may be coupled to the bus 102 for communicating information and command selections to the processor 104. Another type of user input device is cursor control device 116, such as a mouse, a trackpad, or similar input device for communicating direction information and command selections to processor 104 and for controlling cursor movement on the display 112. Other user interface devices, such as microphones, speakers, etc. are not shown in detail but may be involved with the receipt of user input and/or presentation of output.

The processes referred to herein may be implemented by processor 104 executing appropriate sequences of computer-readable instructions contained in main memory 106. Such instructions may be read into main memory 106 from another computer-readable medium, such as storage device 110, and execution of the sequences of instructions contained in the main memory 106 causes the processor 104 to perform the associated actions. In alternative embodiments, hard-wired circuitry or firmware-controlled processing units may be used in place of or in combination with processor 104 and its associated computer software instructions to implement the invention. The computer-readable instructions may be rendered in any computer language.

In general, all of the above process descriptions are meant to encompass any series of logical steps performed in a sequence to accomplish a given purpose, which is the hallmark of any computer-executable application. Unless specifically stated otherwise, it should be appreciated that throughout the description of the present invention, use of terms such as "processing", "computing", "calculating", "determining", "displaying", "receiving", "transmitting" or the like, refer to the action and processes of an appropriately programmed computer system, such as computer system 100 or similar electronic computing device, that manipulates and transforms data represented as physical (electronic) quantities within its registers and memories into other data similarly represented as physical quantities within its memories or registers or other such information storage, transmission or display devices.

Computer system 100 also includes a communication interface 118 coupled to the bus 102. Communication interface 118 may provide a two-way data communication channel with a computer network, which provides connectivity to and among the various computer systems discussed above. For example, communication interface 118 may be a local area network (LAN) card to provide a data communication connection to a compatible LAN, which itself is communicatively coupled to the Internet through one or more Internet service provider networks. The precise details of such communication paths are not critical to the present invention. What is important is that computer system 100 can send and receive messages and data through the communication interface 118 and in that way communicate with hosts accessible via the Internet.

Thus, systems and methods that enable printing of conformal materials and other waterproof coating materials at high resolution have been described. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method, comprising:
   during a first printing step, printing by a laser-based printing system a material on edges of an electronic component by laser induced spraying, wherein the laser induced spraying sprays droplets of the material with a first droplet size onto the edges of the electronic component;
   curing the material printed during the first printing step;
   during a second printing step, printing by the laser-based printing system the material over portions of the electronic component excluding the edges by laser induced jetting, wherein the laser induced jetting jets droplets of the material with a second droplet size onto the portions of the electronic component excluding the edges, wherein the first droplet size is smaller than the second droplet size; and
   curing the material printed during the second printing step.

2. The method of claim 1, further comprising during the first printing step, the droplets of the material with the first droplet size are sprayed, using a laser of the laser-based printing system, from a layer of the material coated on a transparent or semi-transparent substrate.

3. The method of claim 2, further comprising coating, by a coating system, a uniform layer of the material on the transparent or semi-transparent substrate, the coating comprising:
   driving, by an air or mechanical pump, the material from a syringe containing the material onto the substrate;
   forming a gap between rollers or knifes; and
   translating, by one or more motors, the substrate through the gap to remove excess amounts of the material from the transparent or semi-transparent substrate so as to form the uniform layer of the material on the transparent or semi-transparent substrate with a thickness that is defined by the gap.

4. The method of claim 3, wherein coating further comprises:
   translating, by the one or more motors, the substrate bidirectionally in a controlled manner through the gap so as to form the uniform layer of the material on the substrate with the thickness that is defined by the gap.

5. The method of claim 2, wherein the material is one of: a highly viscous material, a wax material, a polymer material, a mix of a polymer and a monomer material, a heat or light sensitive low viscosity material, a UV-curable material, a heat-curable material, and a dryable material.

6. The method of claim 2, wherein the transparent or semi-transparent substrate is a continuous transparent film substrate, the method further comprising coating the continuous transparent film substrate with a metal layer or with the metal layer and a dielectric layer.

7. The method of claim 1, wherein the curing of the material printed during the first or second printing step is performed by ultraviolet (UV) light and/or heat.

8. The method of claim 2, wherein during one or more of the first and second printing steps, a bottom surface of the transparent or semi-transparent substrate is oriented at an acute angle with respect to a top surface of the electronic component.

9. The method of claim 1, further comprising inspecting, with an inspection module, the electronic component after each of the first and second printing steps, wherein the inspection is performed using an inspection module integrated with the laser-based printing system.

10. The method of claim 2, further comprising:
    during a third printing step, printing by the laser-based printing system the material over yet-to-be printed portions of the electronic component, wherein during the third printing step, a bottom surface of the transparent or semi-transparent substrate is disposed at an acute angle with respect to a top surface of the electronic component; and
    curing the material printed during the third printing step.

* * * * *